(12) United States Patent
Yu et al.

(10) Patent No.: US 10,648,947 B2
(45) Date of Patent: May 12, 2020

(54) MICRO-MAGNETIC DETECTING METHOD AND MICRO-MAGNETIC DETECTING DEVICE

(71) Applicant: NINGBO YINZHOU CITAI ELECTRONIC TECHNOLOGY CO., LTD., Ningbo, Zhejiang (CN)

(72) Inventors: Runqiao Yu, Ningbo (CN); Bin Zhang, Ningbo (CN); Bo Hu, Ningbo (CN); Guisuo Xia, Ningbo (CN); Dongfang Cheng, Ningbo (CN); Qiangqiang Cheng, Ningbo (CN)

(73) Assignee: NINGBO YINZHOU CITAI ELECTRONIC TECHNOLOGY CO., LTD, Ningbo, Zhejiang (CN)

( * ) Notice: Subject to any disclaimer, the term of this patent is extended or adjusted under 35 U.S.C. 154(b) by 406 days.

(21) Appl. No.: 15/125,181

(22) PCT Filed: Jun. 24, 2016

(86) PCT No.: PCT/CN2016/087008
§ 371 (c)(1),
(2) Date: Sep. 11, 2016

(87) PCT Pub. No.: WO2017/008621
PCT Pub. Date: Jan. 19, 2017

(65) Prior Publication Data
US 2017/0176391 A1 Jun. 22, 2017

(30) Foreign Application Priority Data
Jul. 16, 2015 (CN) .......................... 2015 1 0422681

(51) Int. Cl.
*G01R 33/12* (2006.01)
*G01N 27/82* (2006.01)
(Continued)

(52) U.S. Cl.
CPC ............. *G01N 27/82* (2013.01); *G01R 19/04* (2013.01); *G01R 33/10* (2013.01); *G01R 33/1223* (2013.01); *G01N 27/72* (2013.01)

(58) Field of Classification Search
CPC ........ G01N 27/82; G01N 27/72; G01R 19/04; G01R 33/1223; G01R 33/10
See application file for complete search history.

(56) References Cited

U.S. PATENT DOCUMENTS 7,719,266 B1 * 5/2010 Zamanzadeh ...... G01R 33/1223
324/228
2016/0274060 A1 * 9/2016 Denenberg ......... G01N 27/9046

OTHER PUBLICATIONS

Hu et al., "Magnetic non-destructivetestingmethodforthin-platealuminumalloys," Dec. 2011, pp. 66-69.*

* cited by examiner

*Primary Examiner* — Mohamed Charioui
*Assistant Examiner* — Eyob Hagos
(74) *Attorney, Agent, or Firm* — Raymond Y. Chan; David and Raymond Patent Firm

(57) ABSTRACT

A micro-magnetic detecting method includes the steps of: detecting a magnetic induction intensity along a first direction on a surface of a detected object to generate a detection signal, determining whether an amplitude of the detection signal is an anomalous value at a first position of the surface of the detected object, wherein the anomalous value is a value which is inconsistent with a linear value of the detection signal at the first position, and the linear value is a value that satisfies a linear relationship of the detection signal, and determining there is a defect at the first position of the detected object in case that the amplitude of the detection signal is the anomalous value. Accordingly, it detects the magnetic induction intensity on the surface of the (Continued)

detected object so as to detect its surface and internal defects when it remains in its original status.

6 Claims, 17 Drawing Sheets

(51) Int. Cl.
    *G01R 33/10*     (2006.01)
    *G01R 19/04*     (2006.01)
    *G01N 27/72*     (2006.01)

MICRO-MAGNETIC DETECTING METHOD AND MICRO-MAGNETIC DETECTING DEVICE

CROSS REFERENCE OF RELATED APPLICATION

This is a non-provisional application that claims priority to international application number PCT/CN2016/087008, international filing date Jun. 24, 2016, which claims priority to Chinese application number CN201510422681.5, filing date Jul. 16, 2015, the entire contents of each of which are expressly incorporated herein by reference.

NOTICE OF COPYRIGHT

A portion of the disclosure of this patent document contains material which is subject to copyright protection. The copyright owner has no objection to any reproduction by anyone of the patent disclosure, as it appears in the United States Patent and Trademark Office patent files or records, but otherwise reserves all copyright rights whatsoever.

BACKGROUND OF THE PRESENT INVENTION

Field of Invention

The present invention relates to field of detecting technique, and in particularly to a micro-magnetic detecting method and a micro-magnetic detecting device for detecting an underground object so as to inspect the external surface and internal defect of the detected object.

Description of Related Arts

With the advance of inspection technology especially for the industrial production, a nondestructive inspection technology is a need for more and more target objects, such as a long distance pipeline. For example, a long distanced oil and gas pipeline is usually buried underground. A regular work flow for detecting such buried pipeline defect includes the steps of excavating areas of the pipeline site, removing an anticorrosion (heat preservation) layer, inspecting the pipeline, enveloping back the pipeline, and backfilling the pipeline. Such work flow will certainly affect the normal operation of the buried pipeline. Obviously, different pipeline inspection methods for the buried pipeline without excavation or shutting down the pipeline have become an issue that is worth further discussion.

Apparently, a nondestructive inspection or detecting is needed for the target objects like buried pipeline. That is, with a prerequisite of not letting the target object being damaged, separated, or broken, the inspection technique is incorporated with physical methods, including sound, light, electricity, magnetism, etc., to detect properties, conditions, and/or internal structures of a material, a product, or a structure. Here, detecting methods or techniques that are widely utilized in detecting internal and surface defects of the target object are also called nondestructive detection.

There are many nondestructive detecting methods in the art, including ultrasonic detecting method, turbulent flow detecting method, ray detecting method, etc. . . The ultrasonic detecting method uses an interaction between ultrasonic wave and the target object to provide feedback to be implemented. Although sound can be transmitted in metals, ultrasonic wave decays quickly in the air, which is the major drawback of this method. As a result, it usually requires coupling agent, such as oil or water, serving as a communication medium for the sound.

Ray detecting method is also a nondestructive detecting method that utilizes physical effect (such as a change of radiation intensity, scattering, etc.) generated in an interaction between ionization radiation and the object, so as to detect a discontinuity, a structure, or a thickness inside of a workpiece.

Turbulent flow detecting method is based on electromagnetic induction theory, so it can detect surface defects and near-surface defects of the workpiece. Outstanding features of the turbulent flow detecting method are that it works on conductive materials, which are not necessarily ferromagnetic materials. However, it functions poorly on ferromagnetic materials. Besides, smoothness, flatness, and boundary of surfaces of the workpiece to be detected will all greatly influence the turbulent flow. Therefore, the turbulent flow detecting method is usually applied to detect flaw on non-ferromagnetic workpiece with relative regular shape and smooth surface, such as copper pipe. Moreover, the turbulent flow detecting method also requires exciting source, which becomes not applicable when there is no exciting source in certain circumstances.

Therefore, there needs improved nondestructive detecting techniques.

SUMMARY OF THE PRESENT INVENTION

Technical issues that the present invention intends to solve include overcoming conventional drawbacks and providing a micro-magnetic detecting method and a micro-magnetic detecting device that are able to nondestructively detect external surface and internal defects of the detected object.

An aspect of the present invention provides a micro-magnetic detecting method for a detected object comprising the steps of: detecting a magnetic induction intensity along a first direction on a surface, i.e. an external surface, of the detected object to generate a detection signal; determining whether an amplitude of the detection signal is an anomalous value at a first position of the surface of the detected object, wherein the anomalous value is a value which is inconsistent with a linear value of the detected signal at the first position and the linear value is a value that satisfies a linear relationship of the detected signal in the first direction; and determining that there is a defect at the first position of the detected object when the amplitude of the detection signal is the anomalous value.

In the above micro-magnetic detecting method, in case that a material of the detected object is a paramagnetic material, when a relative magnetic permeability of the first position is smaller than a relative magnetic permeability of the detected object, the anomalous value is greater than the linear value, and when the relative magnetic permeability of the first position is greater than the relative magnetic permeability of the detected object, the anomalous value is smaller than the linear value.

In the above micro-magnetic detecting method, in case that the material of the detected object is a diamagnetic material, when the relative magnetic permeability of the first position is smaller than the relative magnetic permeability of the detected object, the anomalous value is smaller than the linear value, and when the relative magnetic permeability of the first position is greater than the relative magnetic permeability of the detected object, the anomalous value is greater than the linear value.

The above micro-magnetic detecting method further comprises: drawing a first signal curve of the amplitude of the detection signal against a relative distance of the detected object in the first direction.

In the above micro-magnetic detecting method, the surface of the detected object is parallel to a horizontal plane.

In the micro-magnetic detecting method, the detected object is at least one of a workpiece and/or a weld slit, wherein the defect of the detected object comprises at least one of a surface defect of the workpiece, an internal defect of the workpiece, and/or an internal defect of the weld slit.

In the micro-magnetic detecting method, a magnitude of a difference of the anomalous value and the linear value is corresponding to a size of the defect.

In the above micro-magnetic detecting method, the step of determining whether the amplitude of the detection signal is the anomalous value further comprises: determining each maximum value and minimum value on the first signal curve, subtracting each maximum value respectively with two adjacent minimum values to obtain a first difference and a second difference, selecting a larger one of the first difference and the second difference as a characteristic of a peak-peak value corresponding to each maximum value, and determining that the amplitude of the detection signal is the anomalous value when the characteristic of the peak-peak value of the first position is larger than a predetermined threshold.

In the above micro-magnetic detecting method, after the step of selecting the larger one of the first difference and the second difference as the characteristic of the peak-peak value corresponding to each maximum value, further comprises: based on characteristics of normal distribution of the characteristics of the peak-peak value, when $\xi$ is a random variable, $\mu$ is mathematical expectation, and $\sigma$ is mean square error, calculating the probability of the characteristics of the peak-peak value being in an interval of $(0, \mu \pm 2\sigma)$ to be 0.9545 according to formula (1):

$$P(\xi) = P(\mu - a\sigma < \xi < \mu + a\sigma) = \int_{\mu-a\sigma}^{\mu+a\sigma} y\,dx \quad (1)$$

wherein, $$y = P(x) = \frac{1}{\sqrt{2\pi\sigma^2}} e^{-\frac{(x-\mu)^2}{2\sigma^2}} \quad (2)$$

and, $\alpha$ is an abscissa $\mu$ of a standard normal distribution; an interval of the peak-peak value for the probability of 0.9545 is obtained according to formula (1); the step of determining the amplitude of the detection signal is the anomalous value in case that the characteristics of the peak-peak value of the first position is greater than the predetermined threshold specifically comprises: determining that the amplitude of the detection signal is the anomalous value when the characteristics of the peak-peak value of the first position is greater than an upper limit of the interval of the peak-peak value.

The above micro-magnetic detecting method further comprises the steps of: calculating magnetic gradient of the magnetic induction intensity of the detection signal based on the amplitude of the magnetic induction intensity of the detection signal; the step of drawing the first signal curve of the amplitude of the detection signal against the relative distance of the detected object in the first direction specifically comprises: drawing a first signal curve of the magnetic gradient of the detection signal against the relative distance of the detected object in the first direction; and the step of determining whether the amplitude of the detection signal is the anomalous value further comprises: based on the characteristics of normal distribution of the magnetic gradient, when $\xi$ is a random variable, $\mu$ is mathematical expectation, and $\sigma$ is mean square error, calculating the probability of the magnetic gradient being in the interval of $(\mu-\alpha\alpha, \mu-k\alpha\sigma)$ to be 0.9545 according to formula (1):

$$P(\xi) = P(\mu - a\sigma < \xi < \mu + a\sigma) = \int_{\mu-a\sigma}^{\mu+a\sigma} y\,dx \quad (1)$$

wherein, $$y = P(x) = \frac{1}{\sqrt{2\pi\sigma^2}} e^{-\frac{(x-\mu)^2}{2\sigma^2}} \quad (2)$$

and, $\alpha$ is an abscissa $\mu$ of standard normal distribution; the interval of the magnetic gradient for the probability of 0.9545 is obtained according to formula (1); and the step of determining that there is defect at the first position of the detected object when the amplitude of the detection signal is the anomalous value specifically comprises: determining that the amplitude of the detection signal is the anomalous value when the magnetic gradient of the first position exceeds the upper or lower limit of the interval of the magnetic gradient.

The above micro-magnetic detecting method further comprises the steps of: conducting a gradient process for the amplitude of the magnetic induction intensity of the detection signal to calculate the gradient vectors of each point of the detection signal, wherein directions of the gradient vectors are the directions in which the first signal curve obtains a maximum value of a directional derivative of a certain point, wherein a norm of the gradient vector equals to the maximum value of the directional derivative; and the step of drawing the first signal curve of the amplitude of the detection signal against the relative distance of the detected object in the first direction comprises: drawing a first signal curve of the gradient vector of the detection signal against the relative distance of the detected object in the first direction.

In the above micro-magnetic detecting method, the step of determining whether the amplitude of the detection signal is the anomalous value further comprises: based on the characteristics of normal distribution of the gradient vector, when $\xi$ is a random variable, $\mu$ is mathematical expectation, and $\sigma$ is mean square error, calculating the probability of the gradient vector being in the interval of $(\mu-\alpha\sigma, \mu+\alpha\sigma)$ to be 0.9875 when $\alpha=2.5$ according to formula (1):

$$P(\xi) = P(\mu - a\sigma < \xi < \mu + a\sigma) = \int_{\mu-a\sigma}^{\mu+a\sigma} y\,dx \quad (1)$$

wherein, $$y = P(x) = \frac{1}{\sqrt{2\pi\sigma^2}} e^{-\frac{(x-\mu)^2}{2\sigma^2}} \quad (2)$$

the interval of the gradient vector for $\alpha=2.5$ is obtained according to formula (1); and the step of determining that there is defect at the first position of the detecting object when the amplitude of the detection signal is the anomalous value specifically comprises: determining that the amplitude of the detection signal is the anomalous value when the gradient vector of the first position exceeds the upper or lower limit of the interval of the gradient vector.

Another aspect of the present invention provides a micro-magnetic detecting device, comprising: a detecting unit for detecting a magnetic induction intensity along a first direction on a surface, i.e. an external surface, of a detected object to generate detection signal, a calculating unit for determining whether an amplitude of the detection signal is an anomalous value at the first position of the surface of the detected object, wherein the anomalous value is a value which is inconsistent with a linear value of the detection signal at the first position, and the linear value is a value(s) that satisfies a linear relationship of the detection signal in the first direction, and a determining unit for determining that there is a defect at the first position of the detected object when the amplitude of the detection signal is the anomalous value.

In the above micro-magnetic detecting device, in case that a material of the detected object is a paramagnetic material, when a relative magnetic permeability of the first position is smaller than a relative magnetic permeability of the detected object, the anomalous value is greater than the linear value, and when the relative magnetic permeability of the first position is greater than the relative magnetic permeability of the detected object, the anomalous value is smaller than the linear value.

In the above micro-magnetic detecting device, in case that the material of the detected object is a diamagnetic material, when the relative magnetic permeability of the first position is smaller than the relative magnetic permeability of the detected object, the anomalous value is smaller than the linear value, and when the relative magnetic permeability of the first position is greater than the relative magnetic permeability of the detected object, the anomalous value is greater than the linear value.

The above micro-magnetic detecting device further comprises: a drawing unti for drawing a first signal curve of the amplitude of the detection signal against a relative distance of the detected object in the first direction.

In the above micro-magnetic detecting device, the surface of the detected object is parallel to a horizontal plane.

In the micro-magnetic detecting device, the detected object is at least one of a workpiece and/or a weld slit, wherein the defect of the detected object comprises at least one of a surface defect of the workpiece, an internal defect of the workpiece, and/or an internal defect of the weld slit.

In the micro-magnetic detecting device, a magnitude of a difference of the anomalous value and the linear value is corresponding to a size of the defect.

In the above micro-magnetic detecting device, the calculating unit is further for: determining each maximum value and minimum value on the first signal curve, subtracting each maximum value respectively with two adjacent minimum values to obtain a first difference and a second difference, selecting a larger one of the first difference and the second difference as a characteristic of a peak-peak value corresponding to each maximum value, and determining that the amplitude of the detection signal is the anomalous value when the characteristic of the peak-peak value of the first position is larger than a predetermined threshold.

In the above micro-magnetic detecting device, after selecting the larger one of the first difference and the second difference as the characteristic of the peak-peak value corresponding to each maximum value, the calculating unit is further for: based on characteristics of normal distribution of the characteristics of the peak-peak value, when $\xi$ is a random variable, $\mu$ is mathematical expectation, and $\sigma$ is mean square error, calculating the probability of the characteristics of the peak-peak value being in an interval of (0, $\mu+2\sigma$) to be 0.9545 according to formula (1):

$$P(\xi) = P(\mu - a\sigma < \xi < \mu + a\sigma) = \int_{\mu-a\sigma}^{\mu+a\sigma} y\,dx \quad (1)$$

wherein, $$y = P(x) = \frac{1}{\sqrt{2\pi\sigma^2}} e^{-\frac{(x-\mu)^2}{2\sigma^2}} \quad (2)$$

and, $\alpha$ is an abscissa $\mu$ of a standard normal distribution; an interval of the peak-peak value for the probability of 0.9545 is obtained according to formula (1); the determining unit is specifically for: determining that the amplitude of the detection signal is the anomalous value when the characteristics of the peak-peak value of the first position is greater than an upper limit of the interval of the peak-peak value.

The above micro-magnetic detecting device further comprises: a first processing unit for calculating magnetic gradient of the magnetic induction intensity of the detection signal based on the amplitude of the magnetic induction intensity of the detection signal; the drawing unit is specifically for: drawing a first signal curve of the magnetic gradient of the detection signal against the relative distance of the detected object in the first direction; and the calculating unit is specifically for: based on the characteristics of normal distribution of the magnetic gradient, when $\xi$ is a random variable, $\mu$ is mathematical expectation, and $\sigma$ is mean square error, calculating the probability of the magnetic gradient being in the interval of ($\mu-\alpha\sigma$, $\mu+\alpha\sigma$) to be 0.9545 according to formula (1):

$$P(\xi) = P(\mu - a\sigma < \xi < \mu + a\sigma) = \int_{\mu-a\sigma}^{\mu+a\sigma} y\,dx \quad (1)$$

wherein, $$y = P(x) = \frac{1}{\sqrt{2\pi\sigma^2}} e^{-\frac{(x-\mu)^2}{2\sigma^2}} \quad (2)$$

and, $\alpha$ is an abscissa $\mu$ of standard normal distribution; the interval of the magnetic gradient for the probability of 0.9545 is obtained according to formula (1); and determining unit is specifically for: determining that the amplitude of the detection signal is the anomalous value when the magnetic gradient of the first position exceeds the upper or lower limit of the interval of the magnetic gradient.

The above micro-magnetic detecting method further comprises: a second processing unit for conducting a gradient process for the amplitude of the magnetic induction intensity of the detection signal to calculate the gradient vectors of each point of the detection signal, wherein directions of the gradient vectors are the directions in which the first signal curve obtains a maximum value of a directional derivative of a certain point, wherein a norm of the gradient vector equals to the maximum value of the directional derivative; and the drawing unit is specifically for: drawing a first signal curve of the gradient vector of the detection signal against the relative distance of the detected object in the first direction.

In the above micro-magnetic detecting method, the calculating unit is specifically for: based on the characteristics of normal distribution of the gradient vector, when $\xi$ is a random variable, $\mu$ is mathematical expectation, and $\sigma$ is mean square error, calculating the probability of the gradient vector being in the interval of $(\mu-\alpha\sigma, \mu+\alpha\sigma)$ to be 0.9875 when $\alpha=2.5$ according to formula (1):

$$P(\xi) = P(\mu - \alpha\sigma < \xi < \mu + \alpha\sigma) = \int_{\mu-\alpha\sigma}^{\mu+\alpha\sigma} y\, dx \quad (1)$$

wherein, $$y = P(x) = \frac{1}{\sqrt{2\pi\sigma^2}} e^{-\frac{(x-\mu)^2}{2\sigma^2}} \quad (2)$$

the interval of the gradient vector for $\alpha=2.5$ is obtained according to formula (1); and the determining unit is specifically for: determining that the amplitude of the detection signal is the anomalous value when the gradient vector of the first position exceeds the upper or lower limit of the interval of the gradient vector.

With the micro-magnetic detecting method and micro-magnetic detecting device according to the embodiments of the present invention, it is possible to detect the surface and internal defects of the detected object by detecting the magnetic induction intensity from the surface of the detected object when it remains in its original status. Therefore, the micro-magnetic detecting method and micro-magnetic detecting device according to the embodiment of the present invention enhances detecting efficiency, reduces detecting cost, and improves the adaptability and performance of the detecting apparatus.

Still further objects and advantages will become apparent from a consideration of the ensuing description and drawings.

These and other objectives, features, and advantages of the present invention will become apparent from the following detailed description, the accompanying drawings, and the appended claims.

DETAILED DESCRIPTION OF THE PREFERRED EMBODIMENT

Figure 1:
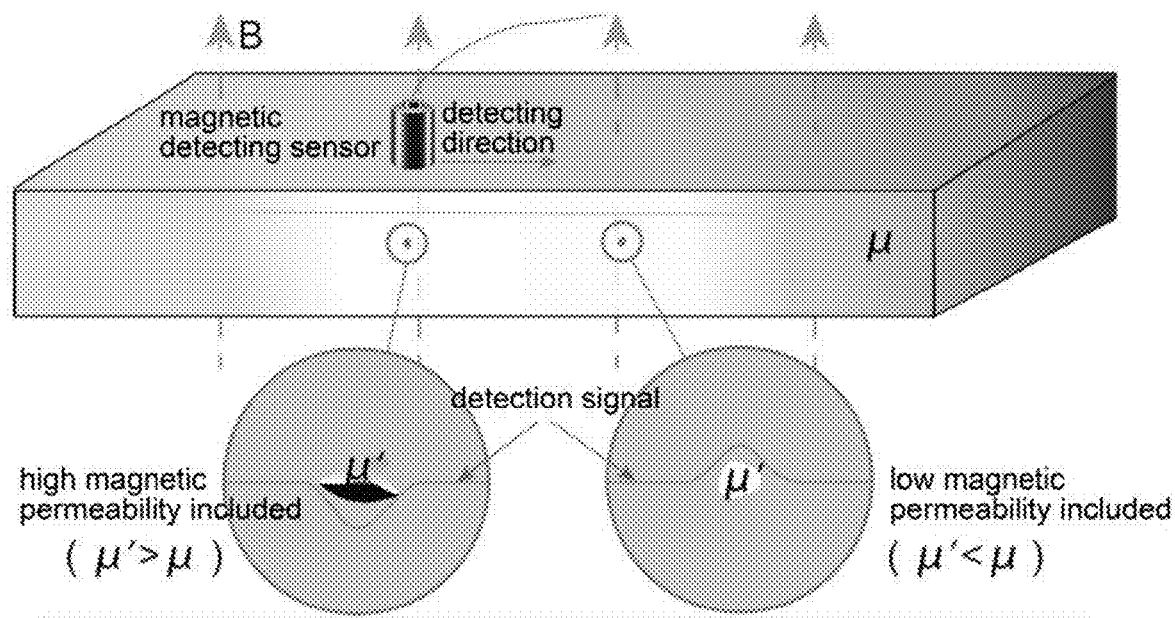
FIG. 1 is a schematic view of a micro-magnetic detecting technology according to a preferred embodiment of the present invention.

The following description is disclosed to enable any person skilled in the art to make and use the present invention. Preferred embodiments are provided in the following description only as examples and modifications will be apparent to those skilled in the art. The general principles defined in the following description would be applied to other embodiments, alternatives, modifications, equivalents, and applications without departing from the spirit and scope of the present invention.

The following applies both the appended drawings and the embodiments to further describe the present invention in detail.

Micro-magnetic detecting technology is based on a foundation of natural magnetic field, which is a nondestructive detecting technique that applies magnetic signal detector to scan and detect the surface or near-surface of the detected sample to determine the changes of magnetic induction intensities in various directions for determine whether there is a defect on the detected sample and applies data processing to determine positions and sizes of the defects.

Based on the requirements of the sampling frequency of the magnetic signal detector, the magnetic signal detector should capture the signals in a uniform speed when conducting signal detection, such that it can describe the changes of amplitude value of the magnetic induction intensity more accurately and further locate and quantify the area of the defects accurately. Magnetic induction intensity of ferromagnetism and paramagnetic materials would increase when an external magnetic field increases. And when the external magnetic field intensity remains constant, the magnetic induction intensity would increase when the relative magnetic permeability increases. Magnetic induction intensity of a diamagnetic material would decrease when the external magnetic field increases. And when the external magnetic field remains, the magnetic induction intensity would decrease when the relative magnetic permeability increases.

One aspect of the embodiment of the present invention provides a micro-magnetic detecting method for an underground detected object, such as an underground pipeline, comprising the steps of: detecting a magnetic induction intensity along a first direction of a surface of the detected object; determining whether the detected magnetic induction intensity is an anomalous value at a first position of the surface of the detected object, wherein the anomalous value is a value which is inconsistent with a linear value of the detected signal at the first position; and determining that there is a defect at the first position of the detected object in case that the detected magnetic induction intensity is inconsistent with the linear value.

In the above micro-magnetic detecting method, in case that a material of the detected object is a paramagnetic material, when a relative magnetic permeability of the first position is smaller than a relative magnetic permeability of the detected object, the anomalous value is greater than the linear value, and when the relative magnetic permeability of the first position is greater than the relative magnetic permeability of the detected object, the anomalous value is smaller than the linear value.

In the above micro-magnetic detecting method, in case that the material of the detected object is a diamagnetic material, when the relative magnetic permeability of the first position is smaller than the relative magnetic permeability of the detected object, the anomalous value is smaller than the linear value, and when the relative magnetic permeability of the first position is greater than the relative magnetic permeability of the detected object, the anomalous value is greater than the linear value.

FIG. 1 is a schematic view of a micro-magnetic detecting technique according to an embodiment of the present invention. Referring to FIG. 1, a test piece to be detected made of ferromagnetic material and/or paramagnetic material is put into an earth magnetic field. If there is a defect on the test piece, the relative magnetic permeability of the test piece would be $\mu$ and the relative magnetic permeability of the defect would be $\mu'$. The arrow indicates a component of the magnetic induction intensity in a direction of the test piece, as indicated by the "B" in FIG. 1.

When $\mu'<\mu$, a defect would have repulsive effect to the magnetic line causing the density of the magnetic line increase at upper and lower ends of the defect near the boundary of the test piece. That is, the magnetic induction intensity on the surface of the test piece would become greater than the magnetic induction intensity on the surface of a defect-free test piece. At this moment, the magnetic induction intensity at the defect position will generate an unusual upward peak. When $\mu'>\mu$, the defect would have attraction to the magnetic line causing the density of the magnetic line decrease at the upper and lower ends of the defect near the boundary of the test piece. That is, the magnetic induction intensity on the surface of the test piece would become weaker than the magnetic induction intensity on the surface of the defect-free test piece. At this moment, the magnetic induction intensity at the defect position will generate an unusual downward peak.

Figure 2:
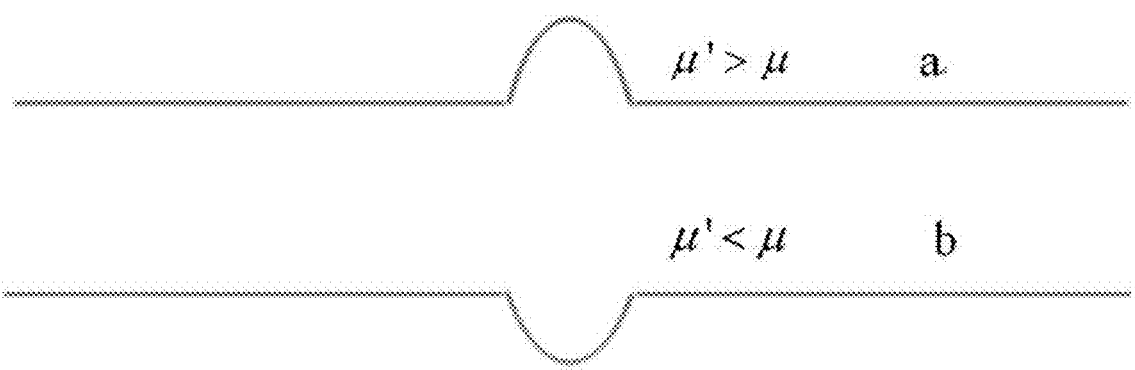
FIG. 2 is a schematic view of an anomalous change of a magnetic field at a position of a defect of a diamagnetic material.

For diamagnetic material test piece, when $\mu'>\mu$, a defect would have repulsive effect to the magnetic line causing the density of the magnetic line increase at the upper and lower ends of the defect near the boundary of the test piece. That is, the magnetic induction intensity on the surface of the test piece would become greater than the magnetic induction intensity on the surface of the defect-free test piece. At this moment, the magnetic induction intensity at the defect position would generate an unusual upward peak. When $\mu'<\mu$, the defect would have attraction to the magnetic line causing the density of the magnetic line decrease at the upper and lower ends of the defect near the boundary of the test piece. That is, the magnetic induction intensity on the surface of the test piece will become weaker than the magnetic induction intensity on the surface of the defect-free test piece. At this moment, the magnetic induction intensity at the defect position would generate an unusual downward peak, as indicated in FIG. 2. FIG. 2 is a schematic view of an anomalous change of the magnetic field at the defect position of the diamagnetic material.

Therefore, the micro-magnetic detecting method according to the embodiment of the present invention is able to detect the magnetic induction intensity from the surface of the detecting object directly. Because the magnetic induction intensity detected from the surface changes linearly when there is no defect detected from the surface, hence, it can determine that whether there is the defect at a certain position through comparing the detected magnetic induction intensity and the linear value.

It can be seen that the micro-magnetic detecting technique according to the embodiment of the present invention does not require cleaning up of the surface of the test piece. Instead, it conducts detecting while the test piece remains in its original status and is able to detect both the surface and internal defects without being restricted by the thickness of the workpiece to be detected. Also, it is not necessary to fill couplant between the micro-magnetic detecting apparatus and the test surface when utilizing the micro-magnetic detecting method according to the embodiment of the present invention. It is also possible to conduct contactless detecting under certain special conditions without using special magnetizing apparatus (active magnetic excitation apparatus is not required). Besides, the micro-magnetic detecting apparatus has a small volume, a light weight, an independent power source and a recording device, and has a fast detecting speed. The distinguishing features of the technique can conclusively include the following.

(1) It has wide applicable scope that can be applies to most industrial materials (including: iron and steel, aluminum, alloy, silicon crystal, organic glass, etc.).

(2) It has high detecting efficiency. The detecting efficiency is greatly enhanced because it requires less smoothness of the surface of the workpiece for the detecting process and requires no couplant.

(3) The application is flexible that various automatic detecting systems can be developed for various detected objects. Corresponding bundled software can accomplish data processing and analyzing.

Figure 3:
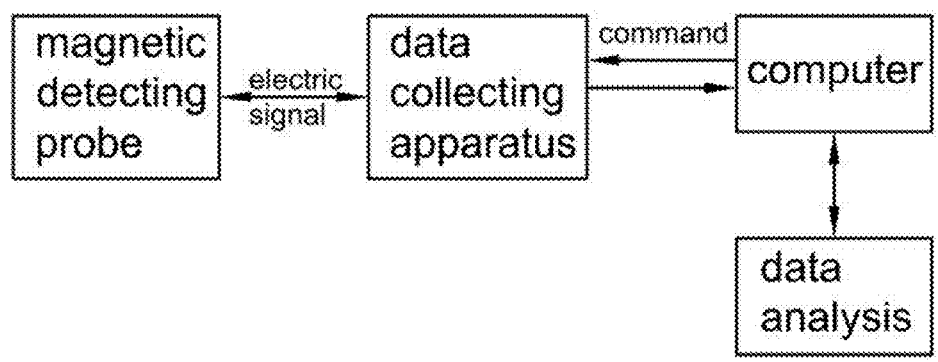
FIG. 3 is a system principle diagram of a micro-magnetic detecting apparatus according to the above preferred embodiment of the present invention.

The micro-magnetic detecting apparatus that applies the micro-magnetic detecting technique according to the embodiment of the present invention is mainly constituted by an array type magnetic detecting probe, a data collecting apparatus, and a computer, as shown in FIG. 3. FIG. 3 is a system principle diagram of the micro-magnetic detecting apparatus.

Figure 4:
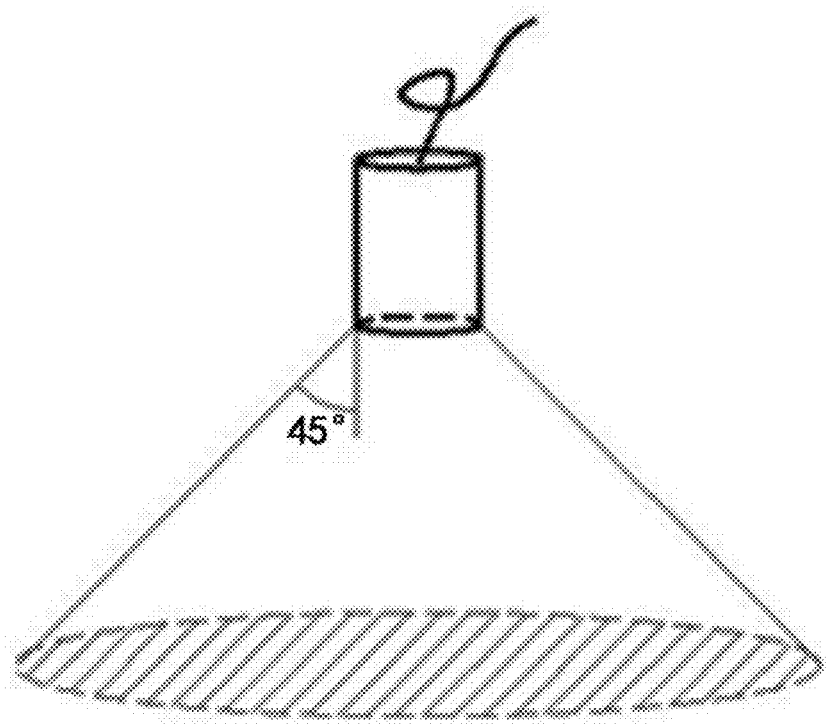
FIG. 4 is a schematic view of an effective detecting area of a magnetic detecting probe.

The magnetic detecting probe does not have to contact the test piece during the detection. The effective detecting scope is expanded outwardly from front of the probe in 45 degrees, so an effective detecting area of the probe has proportional with the square of the lifting height. FIG. 4 is a schematic view of an effective detecting area of a magnetic detecting probe. Referring to FIG. 4, shaded area in the figure indicates the effective detecting area of the probe. However, test sensitivity of the magnetic detecting probe decreases along with the increase of the lifting height.

When detecting a flaw of a turbine disc, considering the complexity of shape of a surface of the workpiece of turbine disc, the micro-magnetic detecting probe can be arranged and composed based on the needs of the detection and the actual conditions of the surface of the workpiece. For example, an array type micro-magnetic detecting probe is formed with micro-magnetic detecting probes and a probe mounting frame. The micro-magnetic detecting probes can be arranged in a sawtooth manner, wherein each probe is apart from its adjacent probes by 12 mm. A certain distance between the probes is to prevent the probes from interfere with each other. Based on the needs of the detection, the probe mounting frame can also have a probe mounted on a higher lifting height position to detect environmental magnetic field.

The following will describe how the micro-magnetic detecting method according to the embodiment of the present invention deal with two types of the defect, that is, the surface and internal defect of the workpiece and the internal defect of the weld slit.

Figure 5:
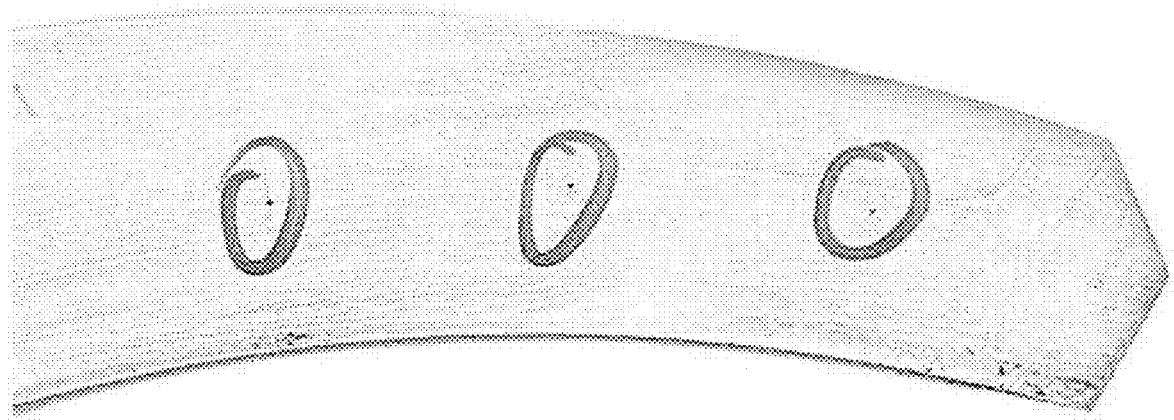
FIG. 5 is a picture of a holes type defect in a first test piece according to the above preferred embodiment of the present invention.
Figure 6A:
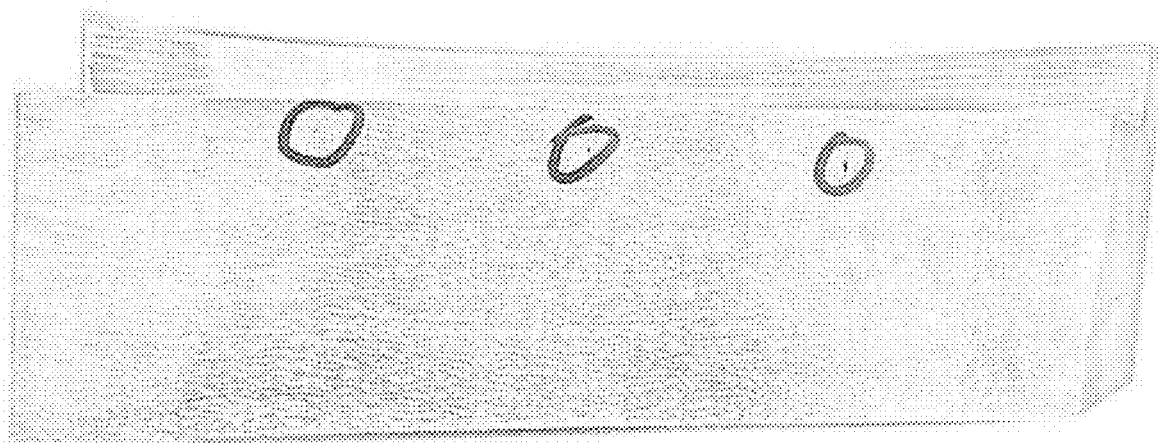
FIG. 6A is a picture of a slot type defect on an A side of the second test piece according to the above preferred embodiment of the present invention.
Figure 6B:
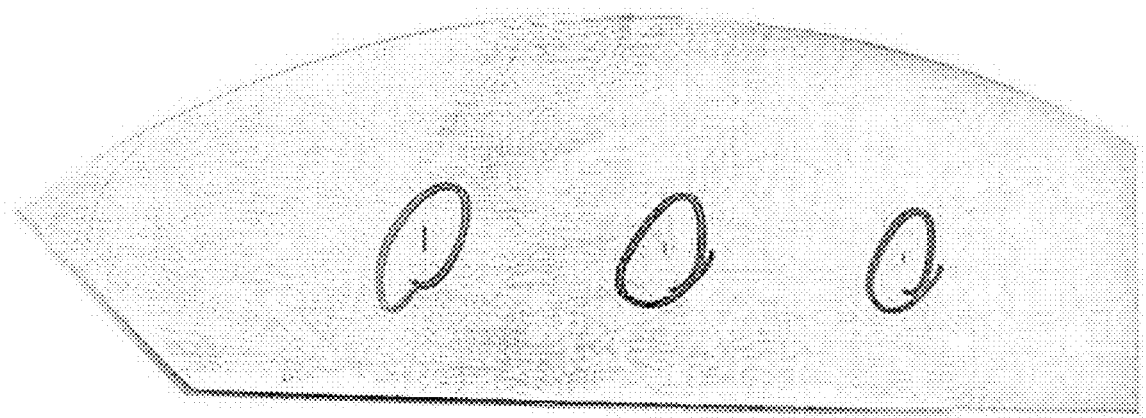
FIG. 6B is a picture of a slot type defect on a B side of the second test piece according to the above preferred embodiment of the present invention.

In order to test the micro-magnetic detecting method according to the embodiment of the present invention, a heat-resisting alloy GH4169 turbine disc without natural defect is selected to be the test piece. The test piece is rough finished and cut. Two of the pieces are to be processed for further artificial defect. Two different types of defects are respectively made on two test pieces. Holes types defects with various depths are made on the first test piece, while slot type defects (for simulating crack defects) with various dimensions are made on the second test piece. The parameters of the holes type defect on the first test piece are: 0.8 mm for the diameter of the holes, 1 mm, 2 mm, and 3 mm respectively for the depths, 30 mm for the distance between adjacent holes, as shown in FIG. 5. FIG. 5 is a picture of the holes type defect on the first test piece. Three slot type defects with different specifications are preset respectively on the A side and B side of the second test piece. Dimensions of the defects are shown in the format of length×width× depth. The parameters of the slot type defects on the A side are: 1 mm×0.15 mm×1 mm, 1 mm×0.25 mm×3 mm, and 1 mm×0.3 mm×5 mm; the distance between adjacent defects is 50 mm; and the distances between the defects and the closest fringes are respectively: 5 mm, 8 mm, and 10 mm, as shown in FIG. 6. FIG. 6A is a picture of the slot type defect on the A side of the second test piece. The parameters of the groove defects on the B side are: 1 mm×0.3 mm×7 mm, 3 mm×0.25 mm×5 mm, and 5 mm×0.3 mm×7 mm; the distance between adjacent defects is 50 mm; and the distance between the defects and the closest fringes is 30 mm, as shown in FIG. 6. FIG. 6B is a picture of the slot type defect on the B side of the second test piece.

Because a turbine disc can be affected by various uncertainties and deviations of the technological parameters during the processing process, many types of defect can come into being in the internal of the turbine disc. However, it is difficult to find out the close-fitting type defects in the turbine disc with regular nondestructive detecting. Because the gap within the close-fitting type defect is too small and mainly exists inside of the workpiece of turbine disc, it cannot be found with the nondestructive detecting technique. Even the ultrasonic detecting technique that is mature in dealing with internal defect detection can barely find this type of defect.

Figure 7:
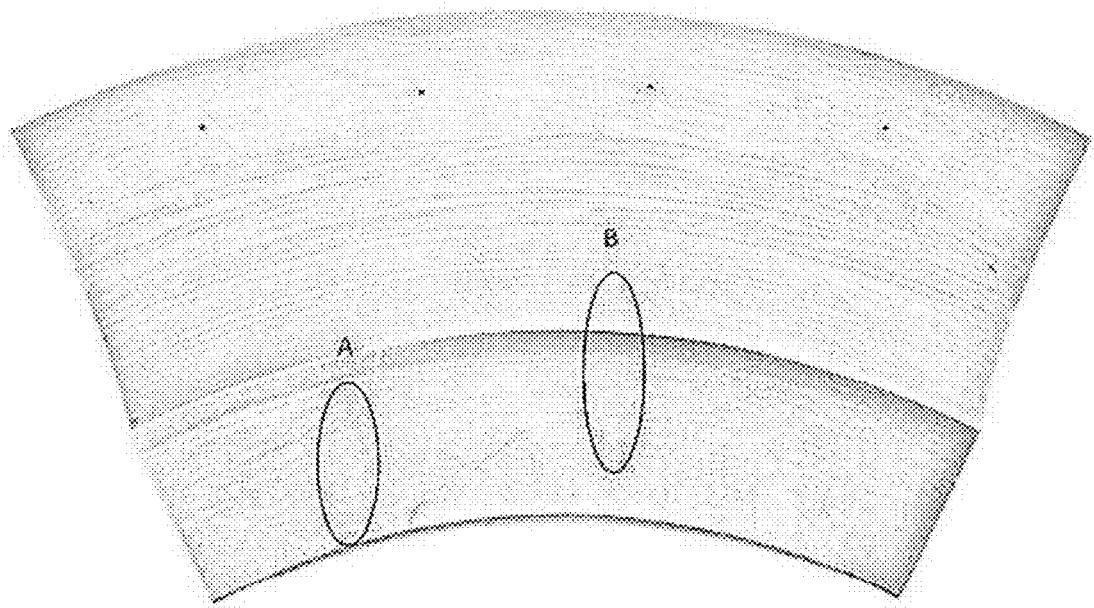
FIG. 7 is a schematic view of a test piece of a turbine disc that has a close-fitting type defect.

The micro-magnetic detecting method according to the embodiment of the present invention has better detecting sensitivity, which is able to sensitively identify the close-fitting type defect in the turbine disc. A turbine disc test piece that has close-fitting type defects during the processing process is selected and part of the turbine disc that contains defects are cut out for the detection, as shown in FIG. 7. FIG. 7 is a schematic view of a test piece of a turbine disc that has close-fitting type defect.

Figure 8A:
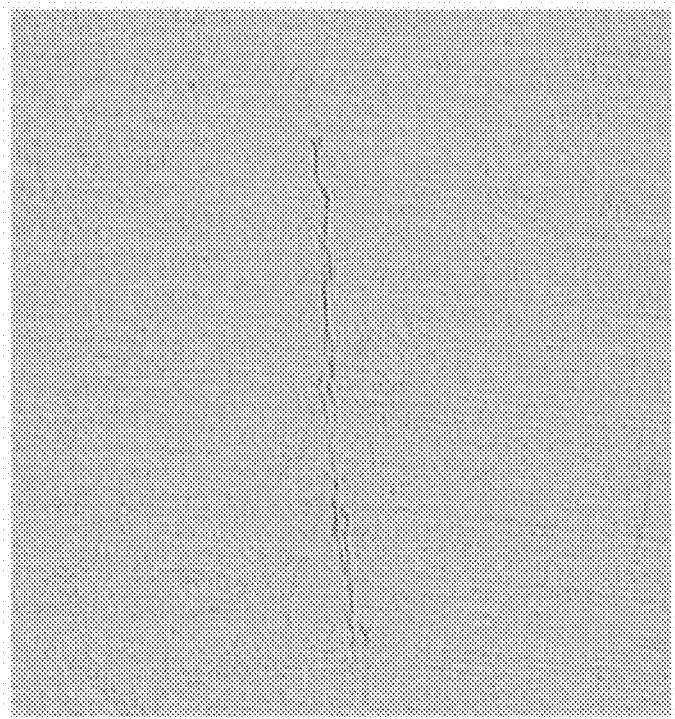
FIGS. 8A and 8B are respectively schematic views of close-fitting type crack defects of a defect A and a defect B of FIG. 7.
Figure 8B:
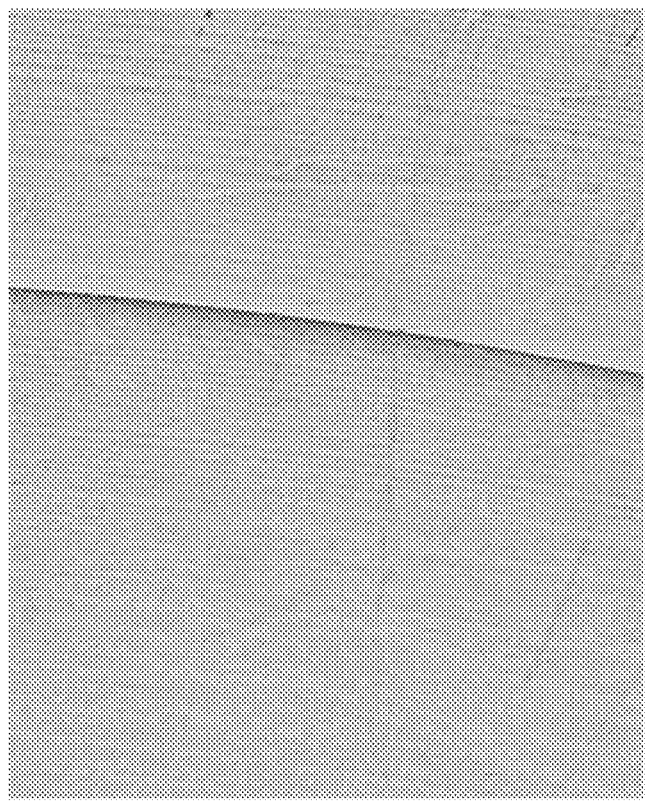

The gap of the close-fitting type defect is too tiny to be identified with naked eyes. When the close-fitting type defect is found with the micro-magnetic detecting method according to the embodiment of the present invention, a corrosive liquid is prepared to corrode the turbine disc test piece, so as to make the internal close-fitting type defect come to surface by the corrosion. Also, because the corrosion process will inevitably enlarge the gap of the close-fitting type defect, so the chemical corroded close-fitting type defect can be identified with naked eyes. After the test piece of FIG. 7 is corroded, close-fitting type crack defects are found in both position A and position B on the test piece. They are partially enlarged and shown in FIGS. 8A and 8B. FIGS. 8A and 8B are respectively schematic views of close-fitting type crack defects of defect A and defect B of FIG. 7. A vernier caliper is utilized to measure that the length of defect A is 16.56 mm and the length of defect B is 24.78 mm.

The turbine disc test pieces with preset artificial defects are put in an environment that has stable magnetic field for the detection. The test piece is stably placed during the detection. Meanwhile, in order for the accuracy of the detection, the framework for placing the test piece does not contain ferromagnetic material. The relative magnetic permeability of the material of the framework is close to 1 as far as possible. The test surface of the test piece to be detected is parallel to the horizontal plane, which means that the test surface is vertical to the direction of the magnetic field that is straight down. If there is outside magnetic field besides the earth magnetic field existing in the environment that the test piece to be detected exists, the outside magnetic field should be eliminated as far as possible. If the outside magnetic field cannot be eliminated, it is required to be stable during the detection. A preferable transferring intensity of the earth magnetic field is smaller than 20 nT. The probe is perpendicularly arranged on the test surface of the test piece to be detected during the detection and is moved to conduct the detection. The movement of the magnetic detecting probe is kept stable as far as possible in order to avoid from generating too strong undesired signal that makes the analysis of the detection signal difficult.

In other word, in the micro-magnetic detecting method according to the embodiment of the present invention, the surface of the detected object is parallel to the horizontal plane.

As stated above, two different types of defects are respectively made on two test pieces. Holes type defects with identical diameter and various depths are made on the first test piece, while slot type defects (for model crack defects) with various dimensions are respectively made on the A side and B side of the second test piece.

Figure 9:
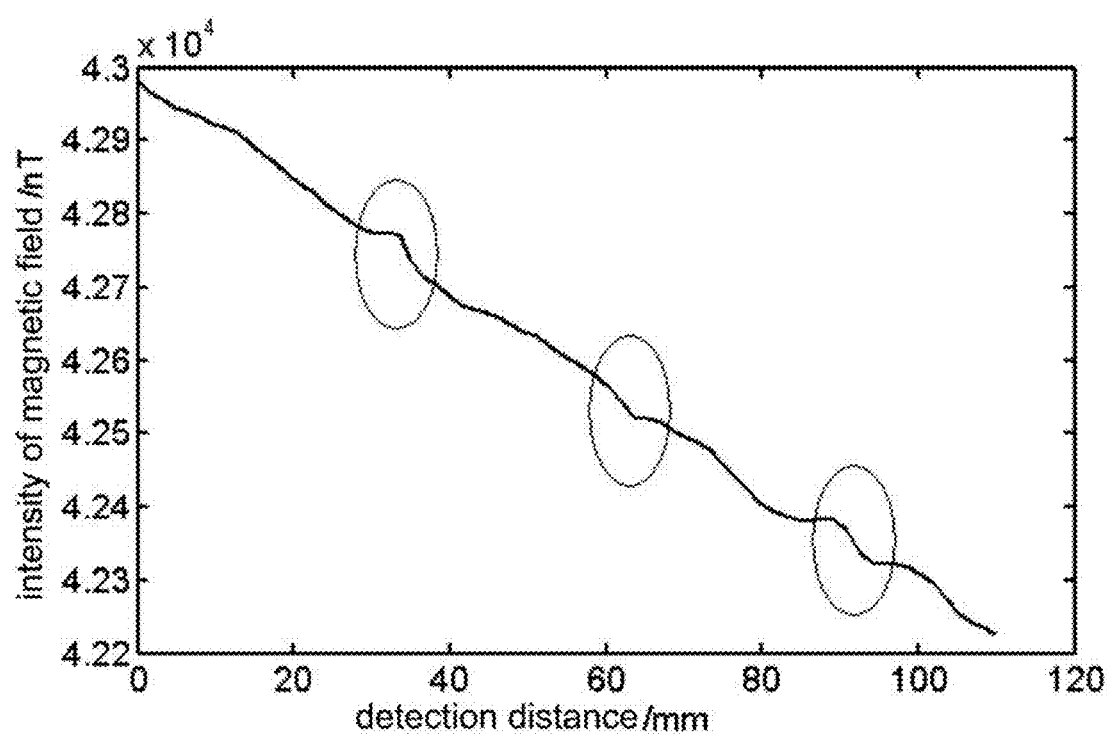
FIG. 9 is a schematic view of the original detection signal of the turbine disc having a $\Phi 0.8$ mm hole.

FIG. 9 is a schematic view of the original detection signal of the turbine disc having a Φ0.8 mm hole. The turbine disc test piece containing Φ0.8 mm holes type artificial defects is tested. The test distance is 110 mm. The result is shown in FIG. 9. Referring to the figure, there are three anomalous magnetic fields in the abscissa direction in the distances of 32 mm, 63 mm, and 93 mm, which are marked with circles. The actual positions of the holes type artificial defects are at 30 mm, 60 mm, and 90 mm. There are certain deviances between the actual positions of the artificial defects and the positions of the defects in the detecting results due to the moving deviation of the magnetic detecting probe during the detecting process. Because it is difficult to keep the magnetic detecting probe running in a uniform speed and the detecting apparatus collects data with time lag during the detection, hence, the positions of the defects shown in the result present a certain deviances from the actual defect positions. However, because the values of the deviances are small, the analysis of the defects would not be affected much.

Figure 10A:
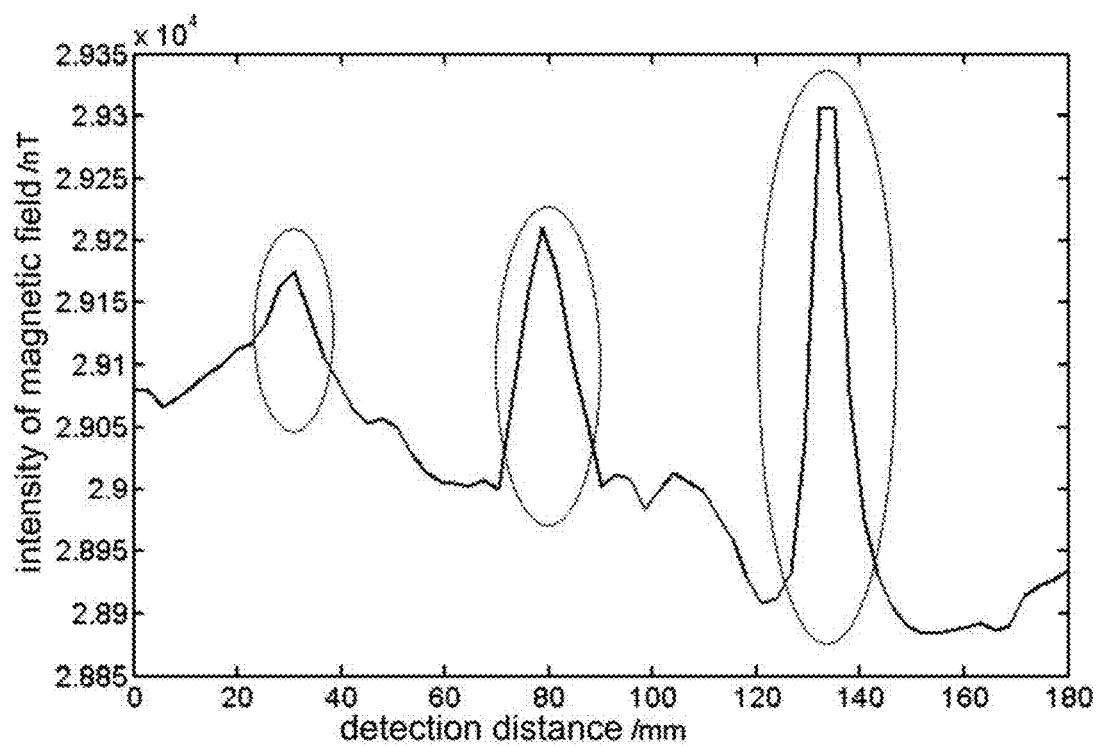
FIG. 10 is a schematic view of the original detection signal of the A side of the second test piece of turbine disc.
Figure 10B:
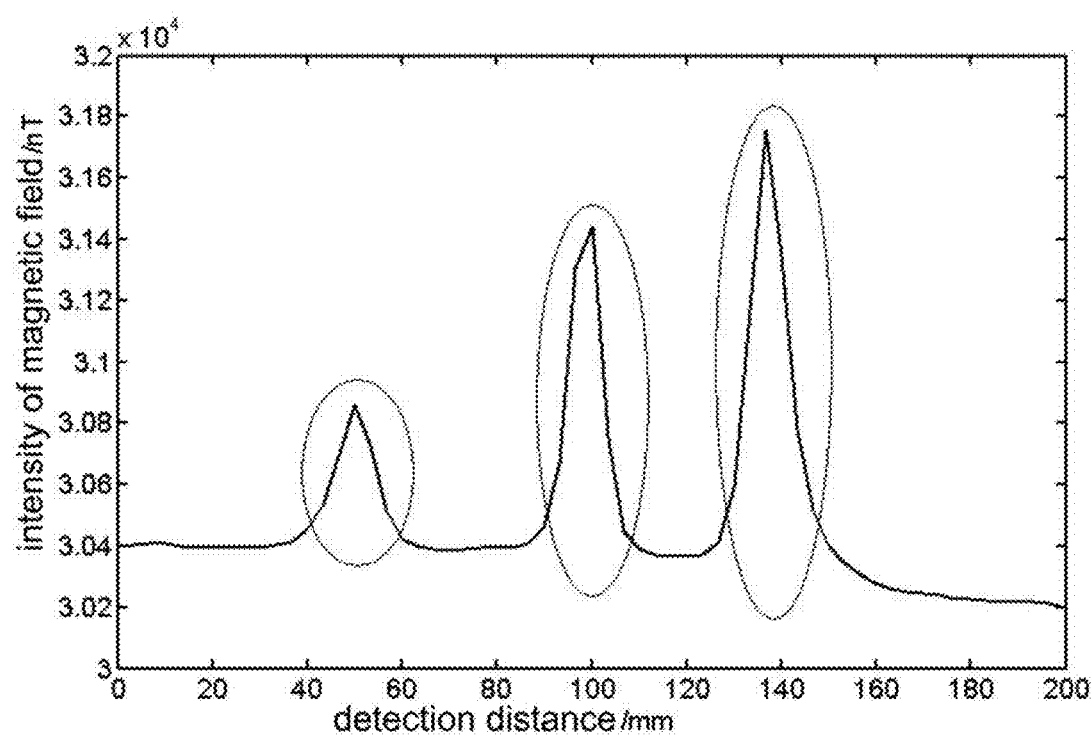
Figure 11:
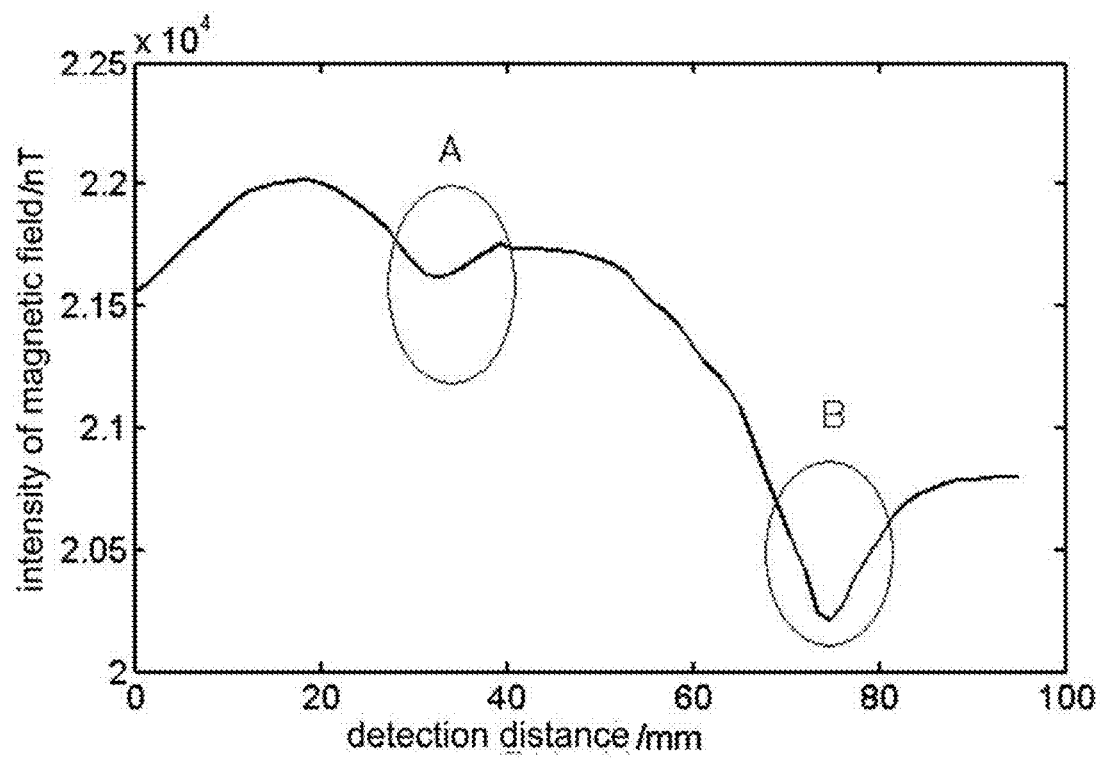
FIG. 11 is a schematic view of the original detection signal of the B side of the second test piece of turbine disc.

FIG. 10 is a schematic view of the original detection signal of the A side of the second test piece of turbine disc. FIG. 11 is a schematic view of the original detection signal of the B side of the second test piece of turbine disc. The A side and B side of the second test piece that contain slot type artificial defects are detected. The results are shown in FIGS. 10 and 11. It can be seen that there are three defects respectively on the two sides of the test piece. The positions of the three defects on the A side in the abscissa direction are respectively at 31 mm, 79 mm, and 132 mm, which only have small deviances from their actual positions of 30 mm, 80 mm, and 130 mm. The anomalous magnetic induction intensities of the signals of the three defects are respectively 110 nT, 210 nT, and 440 nT, which well correspond to the actual sizes of 1 mm×0.15 mm×1 mm, 1 mm×0.25 mm×3 mm, and 1 mm×0.3 mm×5 mm of the slot type defects on the A side. The positions of the three defects on the B side in the abscissa direction are respectively at 50 mm, 100 mm, and 140 mm, which have some deviances from their actual positions of 50 mm, 100 mm, and 150 mm. The anomalous magnetic induction intensities of the signals of the three defects are respectively 580 nT, 1050 nT, and 1380 nT, which well correspond to the sizes of 1 mm×0.3 mm×7 mm, 3 mm×0.25 mm×5 mm, and 5 mm×0.3 mm×7 mm of the slot type defects on the B side.

Therefore, in the micro-magnetic detecting method according to the embodiment of the present invention, the values of the difference between the anomalous value and the linear value is corresponding to the dimensions of the defects, which can be applied to detect the surface defects of the turbine disc very well.

Figure 12:
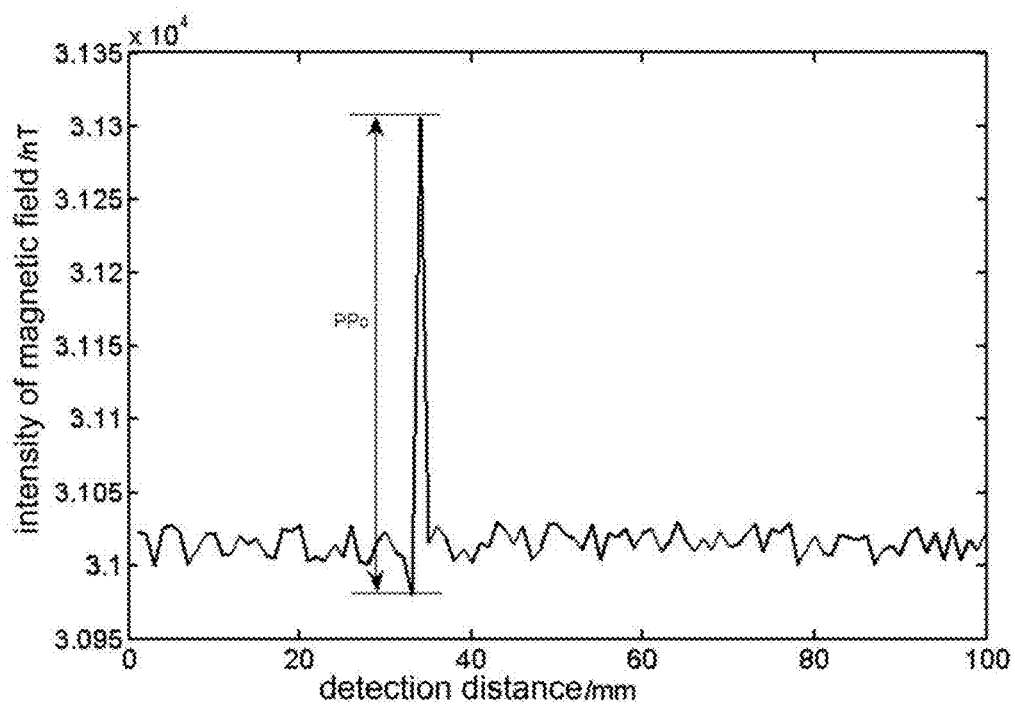
FIG. 12 is a schematic view of the original detection signal of the test piece having close-fitting type natural defect.

FIG. 12 is a schematic view of the original detection signal of the test piece having close-fitting type natural defect. The turbine disc test pieces with the close-fitting type natural defects are put in an environment that has stable earth magnetic field for the detection. For example, the magnetic detecting probe can be utilized to conduct segmental detecting to the turbine disc, where each detecting distance is 95 mm. Then, there is an anomalous magnetic field found in one of the test segment, as shown in FIG. 12. The segment of the turbine disc is cut off. The cut-off piece is shown in FIG. 7. After it was corroded with the chemicals, two close-fitting type crack defects were found. The positions of these defects are at 34 mm and 74.5 mm in the longitudinal direction of the cut turbine disc test piece.

It can be seen in FIG. 12 that there are two defects, marked with A and B, on the test piece. The positions of these two defects are respectively at 33.4 mm and 73.9 mm, which present minor deviances from the actual positions of the defects: 34 mm and 74.5 mm. The values of the anomalous magnetic induction intensities of the signals of the two defects are respectively 180 nT and 550 nT, which can well correspond the defect A and defect B on FIGS. 8A and 8B. Therefore, the micro-magnetic detecting method according to the embodiment of the present invention can also detect the close-fitting type defects inside of the turbine disc very well.

It can be seen from the above that the positions of the defects at the detected object can be intuitively seen by drawing a signal curve of the amplitude of the detection signal against the relative distance of the detected object in a scanning direction. Meanwhile, based on the curve diagram of the signal, the following signal processing and analyzing process can further be conducted.

A first signal curve of the amplitude of the detection signal against the relative distance of the detected object in the first direction is drawn in the micro-magnetic detecting method according to the embodiment of the present invention.

In order to enhance the accuracy of the detection of micro-magnetic detecting method according to the embodiment of the present invention, preferably, the original detection signals are analyzed for identifying the defect signals and non-defect signals from the original detection signals. Usually, when an electromagnetic nondestructive detecting technique is applied to detection of the crack defect, the characteristic of the signal is often anomalous in part of timeline. The main characteristics of the signal include a peak-peak value of the signal, an absolute peak value of the signal, a bandwidth, a difference value of adjacent signals, a signal perimeter, wave shape area, short-time energy, etc. The micro-magnetic detecting method according to the embodiment of the present invention is able to adopt the peak-peak value of the signal to analyze the original detection signal.

In the micro-magnetic detecting method according to the embodiment of the present invention, the step of determining whether the amplitude of the detection signal is the anomalous value further comprises: determining each maximum value and minimum value on the first signal curve, subtracting two adjacent minimum values from each maximum value respectively to obtain a first difference and a second difference, selecting a larger value from the first difference and the second difference as the corresponding characteristic of the peak-peak value for each maximum value, and determining that the amplitude of the detection signal is the anomalous value in case that the characteristic of the peak-peak value of the first position is greater than a predetermined threshold.

The peak-peak value PPo is defined as a greater value of the differences between the amplitude value of the crest of the partial anomalous signal and the amplitude values of the two adjacent troughs, as shown in FIG. 12. FIG. 12 is a schematic view of the peak-peak value PPo of characteristic variable of the detection signal. The calculation of the peak-peak value requires identifying all the maximum values and minimum values of the signal curve, respectively subtracting the two adjacent minimum values from each maximum value, and selecting the greater value therefrom. Such characteristic variable can well exclude the signal fluctuations that are not caused by the defects. Hence, the reliability and accuracy of the signal identification for the defects of the micro-magnetic detecting are greatly enhanced.

Figure 13:
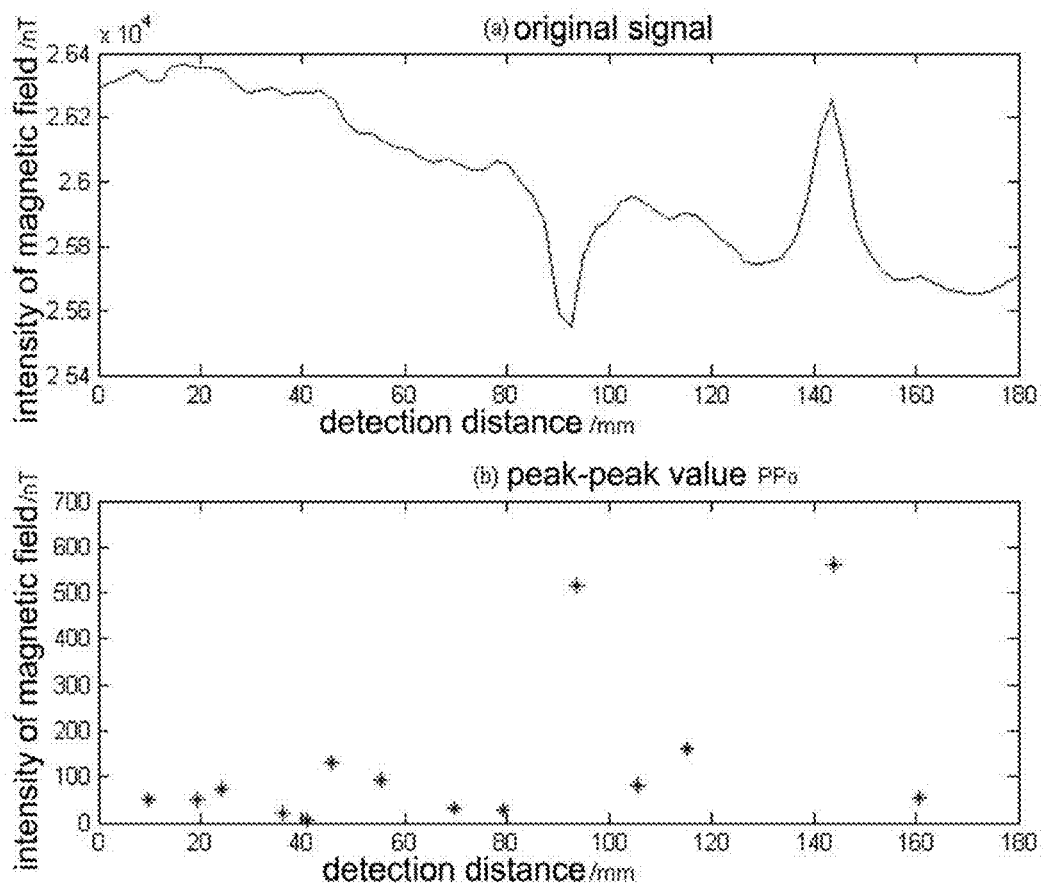
FIG. 13 is an effect view of analyzing the detection signal by combining both of the peak-peak value and the probability statistic.

A manner of the peak-peak value is applied to analyze the detection signal of the test piece of the turbine disc. The result thereof is shown in FIG. 13. FIG. 13 is an effect view of analyzing the detection signal by combining both of the peak-peak value and probability statistic. Referring to (a) of FIG. 13, two defect signals can be found in the original signal, which shows the defects are at 92 mm and 144 mm in the abscissa direction. Referring to (b) of FIG. 13, the peak-peak value PPo shows that PPo values are mostly smaller, but the PPo values at 92 mm and 144 mm in the abscissa direction are larger, which are 516 nT and 562 nT. Therefore, the manner of the peak-peak value can analyze the detection signal well.

Although using peak-peak value can well highlight the sudden changes of the detection signal, nevertheless it is not able to identify which sudden change is caused by a defect factor and which sudden change is within a normal scope. In order to solve this issue, the micro-magnetic detecting method according to the embodiment of the present invention further combines Probability Statistics to analyze the detection signal.

Within the detection signal, there is not only signal of defects, but also fluctuation signal rendered by non-defect factors, such as noise, magnetic detecting probe shaking, etc. Therefore, even if there is no defect within the detecting scope, the detection signal will still have a peak-peak value for the fluctuation, but the peak-peak value would be smaller and the magnitude of the fluctuation will be smaller as well. If the fluctuation is caused by defects, it usually has a greater peak-peak value that exceeds the magnitude of the fluctuation that caused by non-defect factors. Because the micro-magnetic detecting signal has such characteristics, Probability Statistics can be applied to make analysis.

The peak-peak value is utilized for analyzing the signal collected from the turbine disc test piece with the micro-magnetic detecting machine. Distribution of the peak-peak value belongs to random distribution, whose distribution form follows normal distribution, so the analytical theory for the peak-peak value is based on random signal that follows normal distribution. Let $\xi$ is a random variable following normal distribution, $\mu$ is mathematical expectation and $\sigma$ is mean square error. Therefore, the probability of the being in the interval $(\mu-\alpha\sigma, \mu+\alpha\sigma)$ equals to the area enclosed by the normal distribution curve and x-axis in the interval, that is:

$$P(\xi) = P(\mu - \alpha\sigma < \xi < \mu + \alpha\sigma) = \int_{\mu-\alpha\sigma}^{\mu+\alpha\sigma} y\,dx \quad (1)$$

wherein, $$y = P(x) = \frac{1}{\sqrt{2\pi\sigma^2}} e^{-\frac{(x-\mu)^2}{2\sigma^2}} \quad (2)$$

and $\alpha$ is an abscissa $\mu$ in the standard normal distribution.

Table 1 is common quantiles of standard normal distribution, which reflects the relations of probability (P) and the abscissa (u) of standard normal distribution.

TABLE 1

| Common Quantiles of Standard Normal Distribution | | | | | | |
|---|---|---|---|---|---|---|
| P | 0.90 | 0.95 | 0.975 | 0.99 | 0.995 | 0.999 |
| Up | 1.282 | 1.645 | 1.960 | 2.326 | 2.576 | 3.090 |
| Note | $\alpha = 0.10$ one-sided $u_{1-\alpha}$ | $\alpha = 0.05$ one-sided $u_{1-\alpha}$ | $\alpha = 0.05$ two-sided $u_{1-\alpha/2}$ | $\alpha = 0.01$ one-sided $u_{1-\alpha}$ | $\alpha = 0.01$ two-sided $u_{1-\alpha/2}$ | $\alpha = 0.001$ one-sided $u_{1-\alpha}$ |

The micro-magnetic detecting method according to the embodiment of the present invention utilizes the combination of peak-peak values and Probability Statistics to analyze the collected detection signal based on analyzing the signal characteristic obtained from the defect detection of the turbine disc. The peak-peak value is the greater value of the differences between the amplitude value of the crest and the amplitude values of the adjacent troughs. Therefore, the peak-peak value always fluctuates in the interval that is greater than zero. A defect would increase the fluctuation of the peak-peak value and make the differences of the adjacent extreme values follow normal distribution, which mathematical expectation is $\mu=0$ and the effect of the peak-peak value is equal to the absolute value of the difference of the adjacent extreme values. Based on the principles of variance, if a mathematical expectation is $\mu=0$, the variance would remain the same before and after the absolute value is put. Whether it is a signal of defect is identified by applying the probability of 0.9545 for the peak-peak value of the random variable to be in the interval $(0, \mu+2\sigma)$ according to equation (1).

Figure 14:
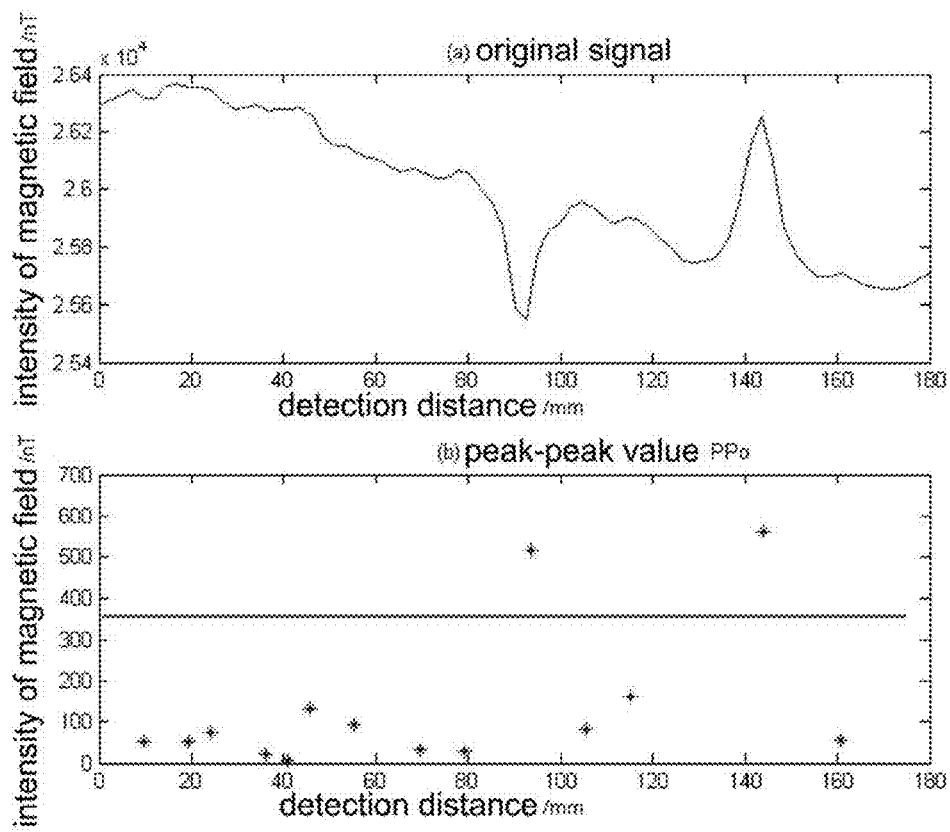
FIG. 14 is an effect view of analyzing the detection signal by combining both of the peak-peak value and the probability statistic.

The peak-peak value of the detection signal in FIG. 13 is analyzed with Probability Statistics. The interval of the peak-peak value for the probability of 0.9545 according to formula (1) is obtained to be (0, 354.7403), whose result is referred in FIG. 14. FIG. 14 is an effect view of analyzing the detection signal by combining both of the peak-peak value and the probability statistical. Referring to FIG. 14, an upper limit of the interval for judging and identifying defect signal is represented as a straight line in the figure. It can be seen in FIG. 14(b) that the detection signal exceeds the interval at 92 mm and 144 mm of the abscissa, which means there are defects at these two positions. Thus, the analysis matches the actual condition of the test piece and one can understand the positions of the defects according to the analysis. Also, applying the micro-magnetic detecting method according to the embodiment of the present invention can not only identify the defect signal, but also locate the defect.

Figure 15:
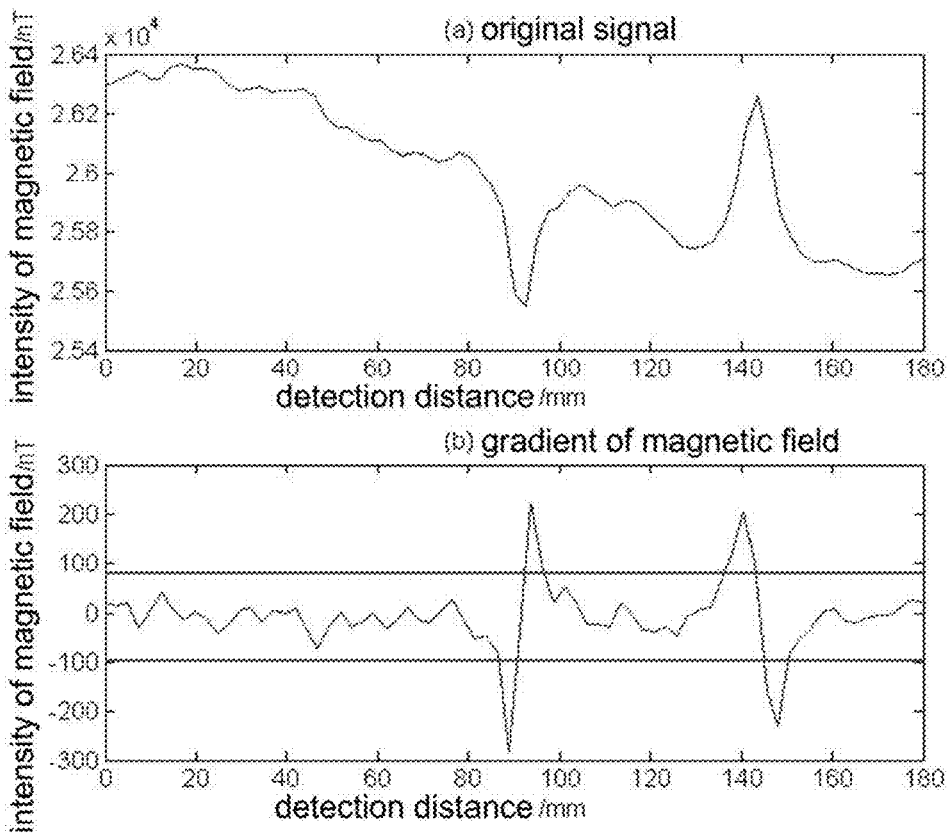
FIG. 15 is an effect view of analyzing the detection signal by combining both of the peak-peak value and the probability statistic.

Besides the characteristics of the peak-peak value, the micro-magnetic detecting method according to the embodiment of the present invention also utilizes magnetic gradient to analyze the magnetic signal, which is advantageous in identifying the defect signal within the detection signal. The magnetic gradient is variance ratio of the magnetic induction intensity along a direction of the space, which is represented with the symbol of dH/dx. The magnetic gradient is a vector. The direction thereof is the direction with the greatest magnetic induction intensity variation. In a uniform magnetic field (dH/dx)=0, while in a non-uniform magnetic field (dH/dx)≠0. As stated above, the magnetic signal collected by the detecting apparatus can be the magnetic induction intensity of the normal direction of the test piece. Then the detection signal can be analyzed with the method that combines magnetic gradient and Probability Statistics. Whether it is a signal of defect is identified by applying the probability of 0.9545 for the magnetic gradient of the random variable to be in the interval according to formula (1). The curve of the original signal of FIG. 13 is processed for gradient analysis and combines Probability Statistics to find out the threshold line for identifying defect signal. The interval of the magnetic gradient for the probability of 0.9545 according to formula (1) is obtained to be (−96.75, 80.89). In FIG. 15(*b*), the interval of the threshold is represented with the upper and lower straight lines. FIG. 15 is an effect view of analyzing the detection signal by combining both of the magnetic gradient and the probability statistic.

It can be seen from FIG. 15(*b*) that there are two positions at which the magnetic signals in the magnetic gradient curve exceed the signal identification line (the threshold line), which indicates that there are two defect signals, in the areas of 86.2 mm~97.7 mm and 139.8 mm~147.1 mm. That is, there are defects in these two areas. The actual positions of the defects are at 92 mm and 144 mm. Therefore, the way that combines magnetic gradient and Probability Statistics to identify defect signal detected by anomalous magnetism is very effective.

The following will describe the detection for the internal defects of weld slit.

Figure 16:
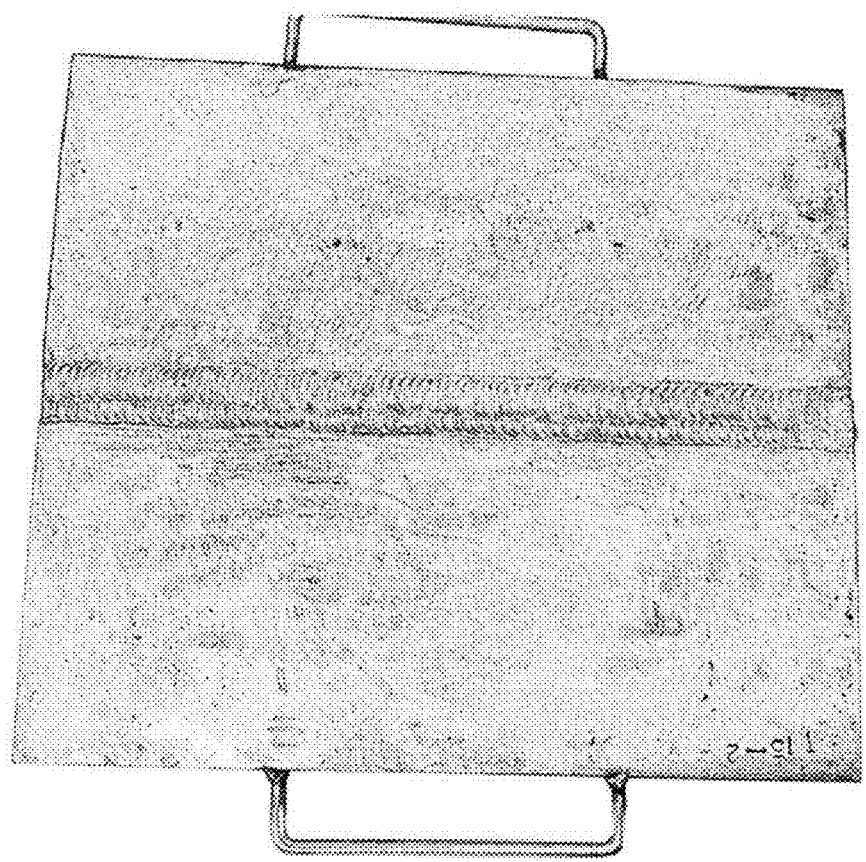
FIG. 16 is a picture of workpiece of a No. 1 weld slit.

FIG. 16 is a picture of workpiece of the No. 1 weld slit. Referring to FIG. 16, the dimensions of the No. 1 steel are 300 mm long, 260 mm wide, and 15 mm thick. The weld slit is 20 mm wide. Also, in order to ensure that the detecting process would not be interfered by the external environment, the influence of environmental magnetic field should be removed. The workpiece should be placed on a smooth and steady place and there should not be strong magnetic source in the surroundings.

Figure 17:
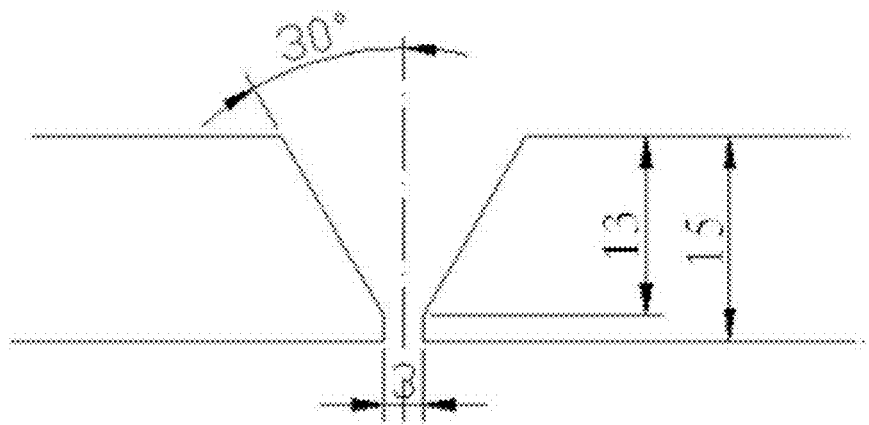
FIG. 17 is a schematic view of parameters of a V-groove of the No. 1 weld slit.

FIG. 17 is a schematic view of parameters of a V-groove of the No. 1 weld slit. As shown in FIG. 17, the type of the groove is a V-groove; the gap of the root of the weldment is 3 millimeters; the root face is 2 millimeters; and the groove angle is 60 degrees.

Figure 18:
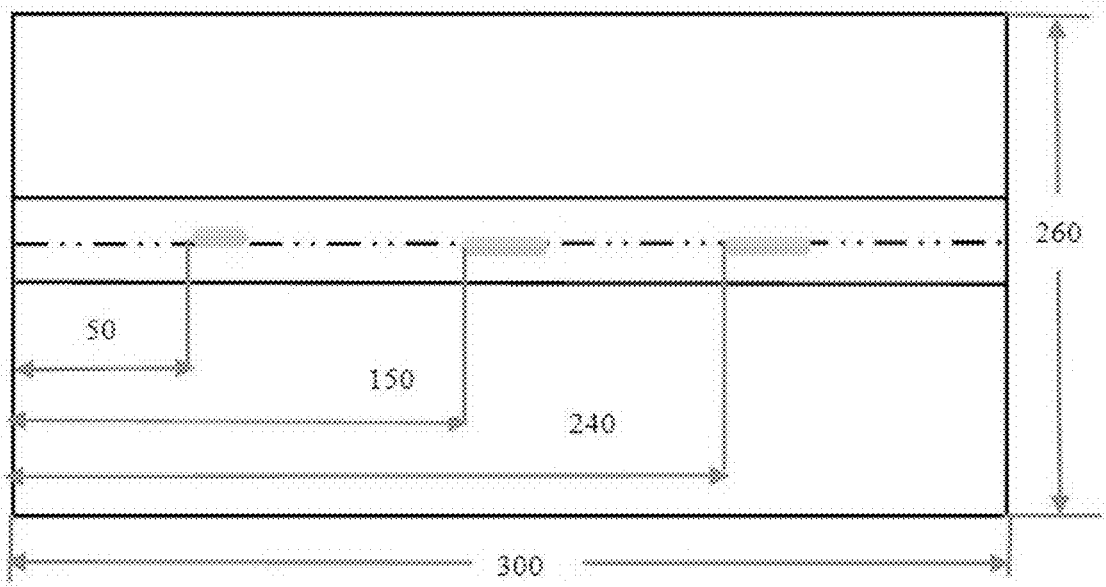
FIG. 18 is a schematic view of arrangement of defects of the No. 1 weld slit.

FIG. 18 is a schematic view of arrangement of the defects of the No. 1 weld slit. Referring to FIG. 18, three artificial defects are made on the weld slit with the following specific parameters. The type of the first defect at 50 mm is incomplete fusion groove, which is 13 mm long, 1 mm wide, 3.5 mm high, and buried 2 mm deep. The type of the second defect at 150 mm is root opened crack, which is 13 mm long, 0.5 mm wide, 3 mm high, and buried 12 mm deep. The third defect is at 240 mm, which defect type is incomplete welding for the root. The parameters are 13 mm long, 1 mm wide, 3 mm high, and 12 mm deep buried.

Figure 19:
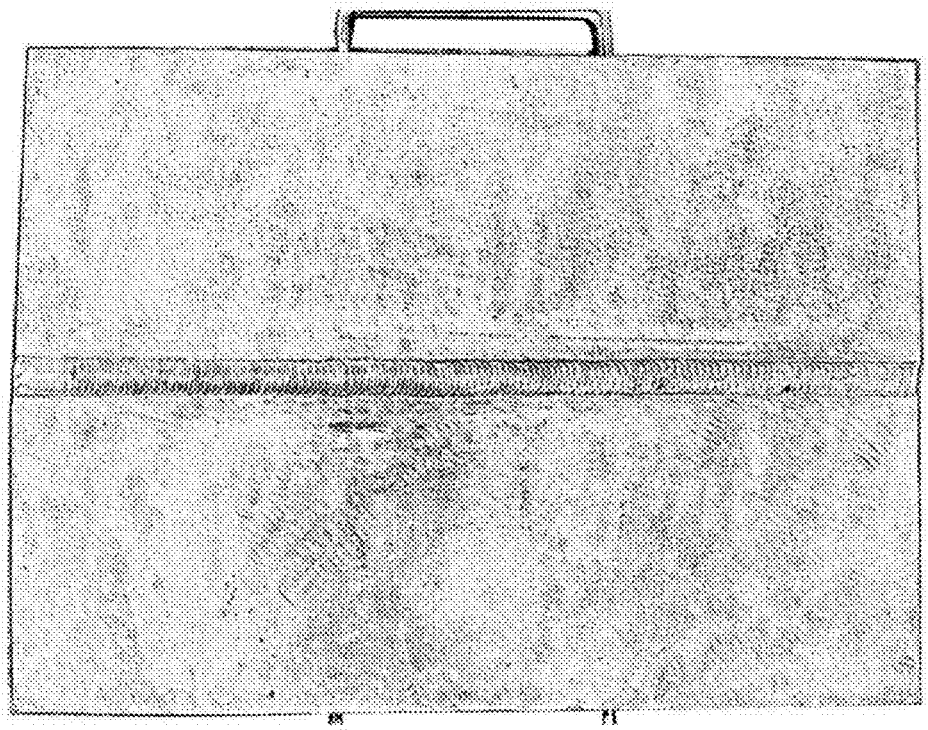
FIG. 19 is a picture of workpiece of the No. 2 weld slit.

FIG. 19 is a picture of workpiece of the No. 2 weld slit. Referring to FIG. 19, the dimensions of the No. 2 weld slit are 400 mm long, 290 mm wide, and 20 mm thick.

Figure 20:
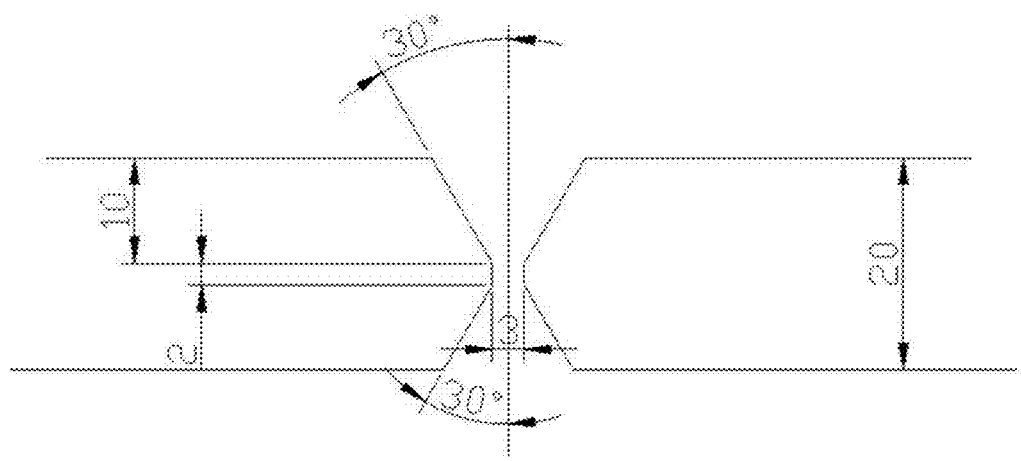
FIG. 20 is a schematic view of parameters of a V-groove of the No. 2 weld slit.

FIG. 20 is a schematic view of parameters of a V-groove of the No. 2 weld slit. As shown in FIG. 20, the type of the groove is an X-groove; the gap of the root of the weldment is 3 millimeters; the root face is 2 millimeters; and the groove angle is 60 degrees.

Figure 21:
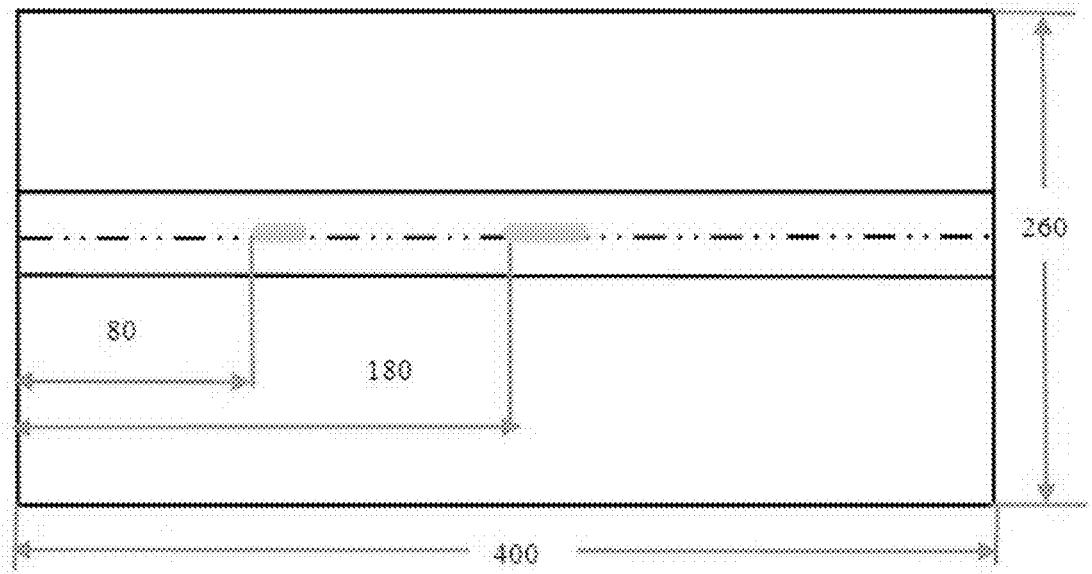
FIG. 21 is a schematic view of arrangement of defects of the No. 2 weld slit.

FIG. 21 is a schematic view of arrangement of the defects of the No. 2 weld slit. Referring to FIG. 21, two artificial defects are made on the weld slit with the following specific parameters. The type of the first defect at 80 mm is incomplete welding for the root, which is 36 mm long, 1 mm wide, 3 mm high, and buried 8 mm deep. The type of the second defect at 180 mm is non-surface-opening crack, which is 38 mm long, 0.5 mm wide, 4 mm high, and buried 16 mm deep.

Then the two weld slit piece containing preset artificial defects are steadily placed. The detecting surface is parallel to the horizontal plane so that the detecting surface can be perpendicular to the direction of the magnetic field. Before the detection, the device can be, for example, arranged at a position to detect the value of the magnetic field under its idling condition. If a fluctuation of curve is smaller than 10 nT, then it proved that the external magnetic environment is stable, so the detection can be officially launched. As the stability of the surrounding magnetic field is ensured, the probe is perpendicularly placed on the plane of the weld slit for detection and pushed to conduct the detection in a uniform speed of 2 meter per minute. The speed and stability are kept the same as far as possible, so as to avoid too much interference and to enhance the result of the detection, which make the subsequent signal analyzing easier.

For example, the exemplified magnetic detecting method for weld slit defect according to the embodiment of the present invention includes the following steps.

(1) Apply a passive magnetic field detecting device to move along a weld slit and detect the magnetic induction intensity. The collected data is drawn into a curve diagram that has abscissa thereof as scanning distance and ordinate thereof as magnetic induction intensity. Data for each point on the curve is raw data. The passive magnetic field detecting device is a high accuracy micro-magnetic detecting sensor.

(2) Assess the raw data and taking the surrounding area of each image that contains fluctuation as gate area. Each gate area is able to contain the curve of fluctuation within the gate area. The fluctuation means that when there is wave crest or trough show on the curve, the crest or trough would be considered as the fluctuation. The gate area should include the curve of the crest or the curve of the trough.

Figure 22:
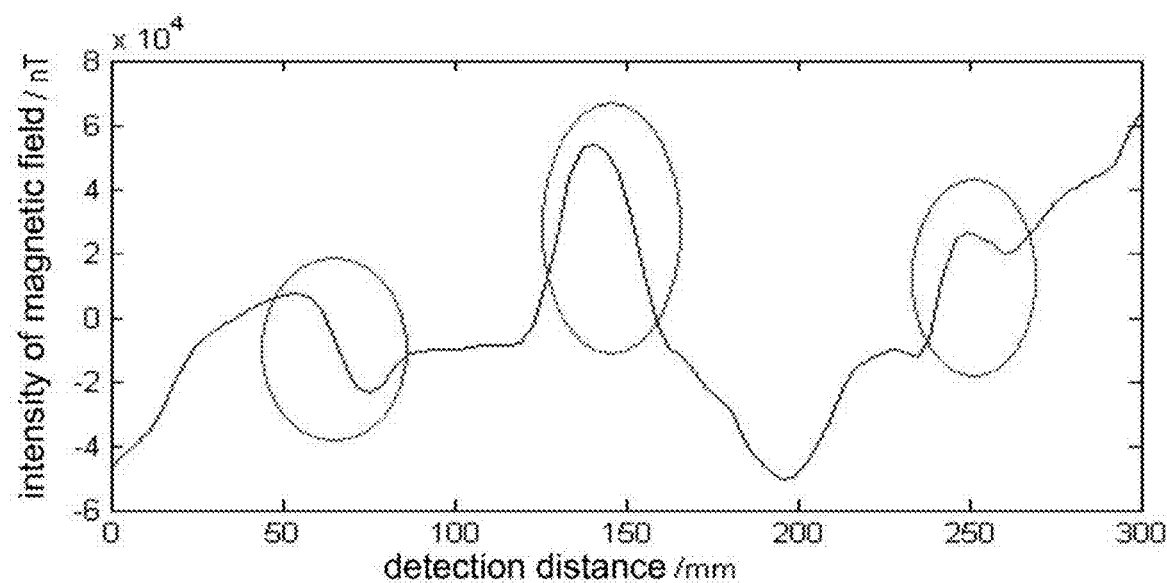
FIG. 22 is a schematic diagram of a result of the detection signal of the No. 1 weld slit.
Figure 23:
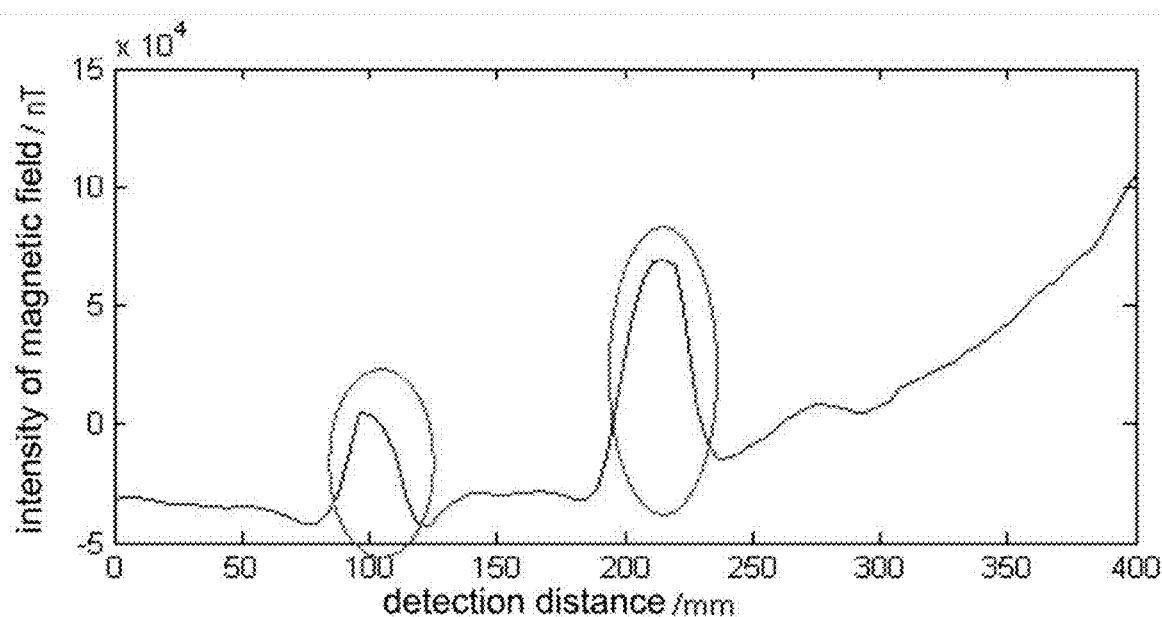
FIG. 23 is a schematic diagram of a result of the detection signal of the No. 2 weld slit.

As shown in FIGS. 22 and 23, the gate area is an oval shape. Initial point of the direction of its minor axis is in front of the fluctuation point of the curve, while the termination point is behind the fluctuation point of the curve. The initial point of the direction of its major axis is below the lowest point of the curve, while the termination point is above the highest point of the curve. All in all, the gate area is able to contain the curve of the fluctuation therewithin. Certainly the gate area can be other shapes, such as a rectangle shape, a circular shape, etc. As long as it can contain the curve of the fluctuation of the gate area, it shall be within the scope sought for protection of the present invention.

(3) Save the curve data of the known defects and corresponding defect types in the database to form a defect database. The defect database is achieved by scanning the weld slits with known defect. The curves of defects in the defect database are also obtained by scanning the weld slits with known defect types. The more images of magnetic induction intensity curve of the defects in the defect database, the more accurate the detection result will be. The data of the curve can be preserved as either image or digital information, which will not affect the analysis of the subsequent steps.

(4) Match every image obtained in step (2) with the images in the defect database to find out the most similar defect image to the image of the gate area and determining the type of the defect by conducting defect identification. It identifies defect by matching the defects, which is to match the image of the gate area with the images in the defect database. If the similarity of an image of defect in the defect database exceeds a certain threshold, it will determine the fluctuation curve of the gate area as such defect.

(5) Associate the data of the defect of the defect type identified with each fluctuation on the original curve diagram obtained in step (1) and making the defect type and the data of the defect to be displayed direct-viewing. Such association contains various types. For example, it can displays the data of the defect when one clicks on the fluctuation on the curve, puts the cursor on the fluctuation, or any other ways. As long as the data of the defect and the fluctuation on the curve are associated, it shall be within the scope sought for protection of the present invention.

Here, the passive magnetic field detecting device is utilized to scan along the weld slit to obtain the curve of the magnetic induction intensity. The ordinate of the curve is magnetic induction intensity, while the abscissa of the curve is scanning distance for the weld slit. The weld slit can be a plate butt weld slit, pipeline butt weld slit, TKY node weld slit, or weld slit in any other shape. The defect database is established with the curve of the magnetic induction intensity variation curve corresponding to each type of weld slit defect, which detects each fluctuation on the magnetic induction intensity curve and matches the defects to determine the defect types and the data of the defects so as to turn them into images and associate the data in the image for carrying out very direct-viewing display to the user of the detecting. This method has the following advantages. First, it is easy to use and does not require any driving source. Second, the detection is fast and highly efficient. If a user feel not worried about the first detecting result, he or she can rapidly conduct multiple detections. Also, because there is corresponding defect database established, all types of defect are able to be detected and processed. If an unknown defect appears, the image and type of that defect and other data can simply be updated into the database.

Here the data of the defect includes, for example, type of the defect, relative position of the defect, burring depth of the defect, etc. The establishment of the date, helps the users to recognize the type of the defect and the data of the defect directly by viewing the image.

In addition, the method can further include a step (6): making the curve diagram into a two-dimensional imaging graph, which turns every defect into a two-dimension image and associates the data of defect with each defect image in the two-dimension image, so as to display the defects in a more direct-viewing manner.

The No. 1 workpiece shown in FIG. 16 is detected and the length detected is 300 mm. FIG. 22 is a diagram of result of the detection signal of the No. 1 weld slit. Referring to FIG. 22, the result shows three anomalous positions on the curve, which are respectively marked by a circle. The first anomalous spot presents at 52 mm, which anomalous amplitude value of magnetic field changes by 31171 nT from 7689 nT of its crest value to −23482 nT of it trough value. The second anomalous spot presents at 148 mm, which anomalous amplitude value of magnetic field changes by 103779 nT from 53952 nT of its crest value to −50827 nT of it trough value. The third anomalous spot presents at 240 mm, which anomalous amplitude value of magnetic field changes by 39444 nT from 26646 nT of its crest value to −12798 nT of it trough value. The three premade artificial defects are respectively at 50 mm, 150 mm, and 240 mm. It can be known that the detecting result is basically conformed through the comparison of the preset defect arrangement. Also, it is able to eliminate the possible causes of either the interference from the external environment or the vibration of the magnetic detecting probe, so great changes of the amplitude values of the three anomalous positions can basically be determined as the defect.

The No. 2 workpiece shown in FIG. 19 is detected and the length detected is 400 mm. FIG. 23 is a diagram of result of the detection signal of the No. 2 weld slit. Referring to FIG. 23, there are two anomalous positions, which are respectively marked by a circle. The first anomalous spot presents at 80 mm, which anomalous amplitude value of magnetic field changes by 46355 nT from 4584 nT of its crest value to −41771 nT of it trough value. The second anomalous spot presents at 187 mm, which anomalous amplitude value of magnetic field changes by 83966 nT from 69715 nT of its crest value to −14251 nT of it trough value. Although the corresponding premade artificial defects are respectively at 80 mm and 180 mm, the minor deviance is within an acceptable limit. It can be known that the detecting result is basically conformed through the comparison of the preset defect arrangement. Also, it is able to eliminate the possible causes of either the interference from the external environment or the vibration of the magnetic detecting probe, so great changes of the amplitude values of the two anomalous positions can basically be determined as the defect.

In order to intuitively determine the position of the defect, the micro-magnetic detecting method according to the embodiment of the present invention preferably make difference processing to the original signal and applies the concept of threshold line to help to position the defect. Because the magnetic induction signal collected in the entire detecting procedure belongs to random variable and follows the normal distribution, one may set $\xi$ to be a random variable that follows the normal distribution, the mathematical expectation thereof to be $\mu$, and the mean square error thereof to be $\sigma$. Then the probability for $\xi$ to appear in the interval $(\mu-Z_\sigma, \mu+Z_\sigma)$ equals to the area enclosed by the normal distribution curve and the x-axis in the interval, that is:

$$P(\xi) = P(\mu - Z\sigma < \xi < \mu + Z\sigma) = \int_{\mu-Z\sigma}^{\mu+Z\sigma} y\,dx \qquad (3)$$

wherein, $$y = P(x) = \frac{1}{\sqrt{2\pi\sigma^2}} e^{-\frac{(x-\mu)^2}{2\sigma^2}} \qquad (4)$$

With equation (3), it can be known that the probability for the random variable to be in the interval of $\mu\pm2\sigma$ is 0.9545. Besides, the threshold line of the anomalous magnetic value is generated based on the equation. Normally, the detected values of magnetic field should be within this interval.

However, when the test piece has defect, based on probability analysis, the values of magnetic field will exceed the threshold. The purpose of applying Probability Statistics principles to find out the threshold lines is for judging whether the test piece contains the defect in a more direct-viewing manner and finding out the position of the defect accurately.

Figure 24:
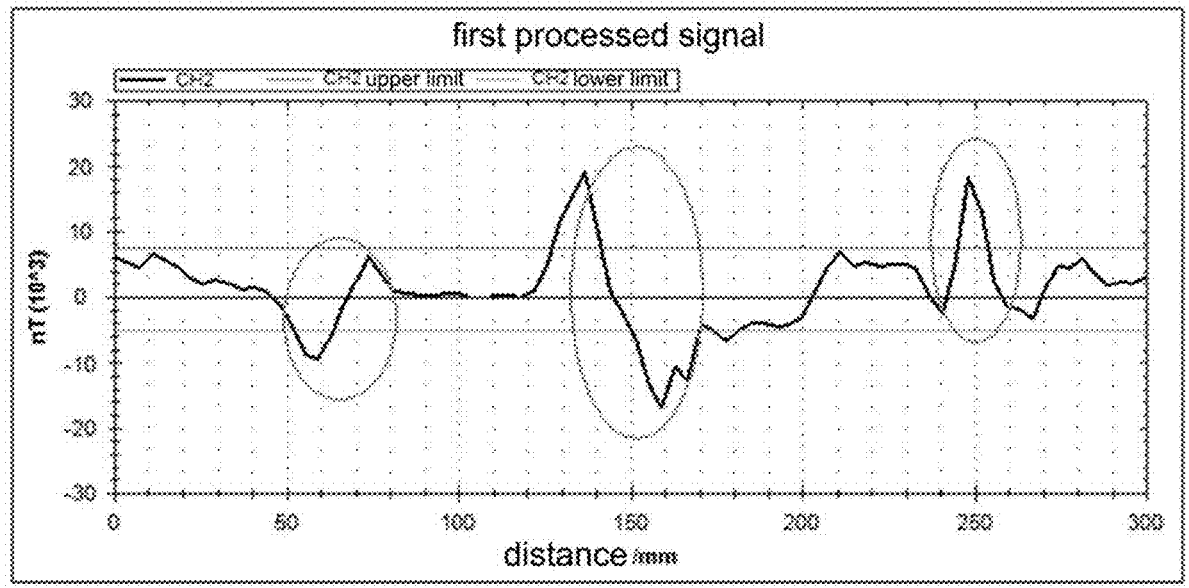
FIG. 24 is a diagram of differential signal of the detection signal of the No. 1 weld slit.

FIG. 24 is a diagram of differential signal of the detection signal of the No. 1 weld slit. Referring to FIG. 24, there are three anomalous positions in the figure, which are respectively marked by a circle. The values of these three anomalous positions all exceed the threshold. The detected length values of those exceed the threshold line are respectively 50 mm, 139 mm, and 242 mm, which basically meet the positions of the preset artificial defects. According to the theory of the differential signal, those exceed the threshold line can be considered as the defects.

Figure 25:
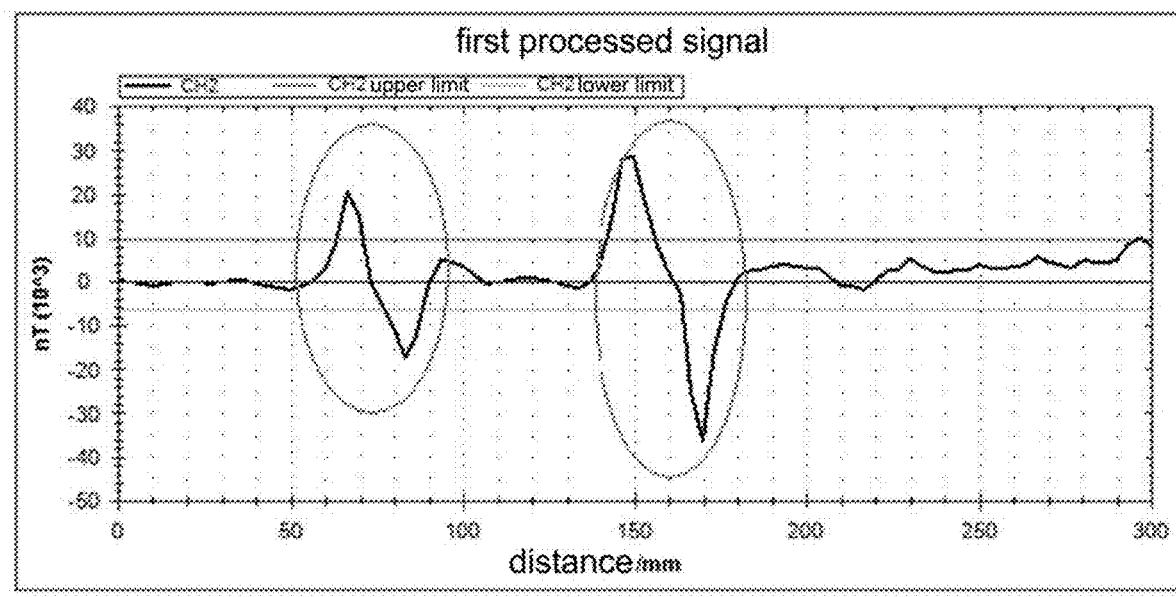
FIG. 25 is a diagram of differential signal of the detection signal of the No. 2 weld slit.

FIG. 25 is a diagram of differential signal of the detection signal of the No. 2 weld slit. Referring to FIG. 25, there are two anomalous positions in the figure. Their values both exceed the threshold. The area of the parts A and B that were circled in the figure exceed the threshold line. The values of detected lengths for the parts that exceed the threshold line are respectively 85 mm-110 mm for part A and 190 mm-220 mm for part B. Besides, other part of the curve is very stable and shows no anomalous condition. The defects are determined by comparing and basically matching with the positions of the preset artificial defects.

Figure 26:
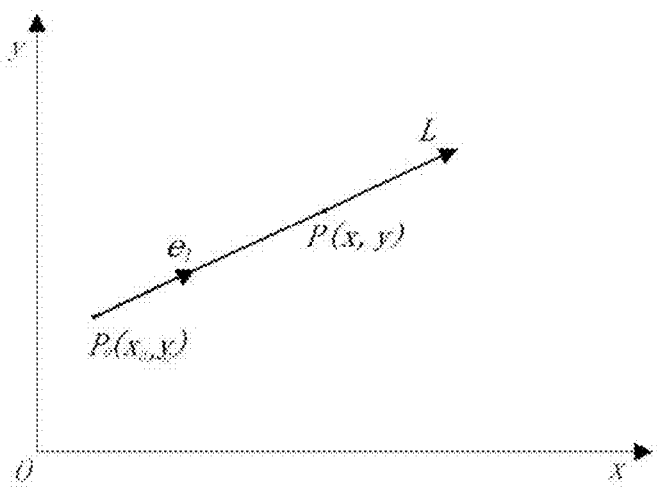
FIG. 26 is a schematic view of a direction vector.

Because the amplitude variation of the original signal of the detection signal is smaller, in order to separate defect signal from regular interference signal, the micro-magnetic detecting method according to the embodiment of the present invention preferably processes the collected original signal. In order to obviously highlight the magnetic signal that comes from the defects, the original signal is preferably processed, so as to show the condition of the fastest magnetic field variations in a certain direction. Its theory is as follows. If there is a straight line L on a two-dimensional coordinate plane. The straight line is a beam started from $P_0(x_0, y_0)$ and $e_l=(\cos \alpha, \sin \beta)$ has the same unit vector as the direction of L, as shown in FIG. 26. FIG. 26 is a schematic view of a direction vector. It can be seen that the expression of the parametric equation of beam L is:

$$\begin{cases} x = x_0 + t\cos\alpha \\ y = y_0 + t\sin\beta \end{cases} \quad (5)$$

And wherein t is a variable that is greater than or equal to zero.

The function expression is $z=f(x,y)$, where it has definition for the neighbourhood $U_0=(P_0)$ of the point $P_0(x_0, y_0)$. $P(x_0+t \cos \alpha, x_0+t \cos \beta)$ is another point on L, and $P \in U(P_0)$. If the ratio of the increment of the function $P(x_0+t \cos \alpha, x_0+t \cos \beta)-f(x_0, y_0)$ and the distance $|PP_0|=t$ of P to $P_0$, when $t \to 0^+$, the limit exists. Then the limit is called the directional derivative of the function $f(x,y)$ at the point $P_0$ along the direction l, which is expressed as $$\left.\frac{\partial f}{\partial l}\right|_{(x_0,y_0)} = \lim_{t \to 0^+} \frac{f(x_0+t\cos\alpha, y_0+t\cos\beta)-f(x_0,y_0)}{t} \quad (6)$$

According to the definition of the directional derivative and its expression form, a directional derivative is the variance ratio of a function $f(x,y)$ at the point $P_0(x_0,y_0)$ along the direction l. Therefore, if the function $f(x,y)$ is differentiable at the point $P_0(x_0,y_0)$, then the directional derivative of the function at the point along any direction l exists, and there is:

$$\left.\frac{\partial f}{\partial l}\right|_{(x_0,y_0)} = f_x(x_0+y_0)\cos\alpha + f_y(x_0, y_0)\cos\beta \quad (7)$$

And wherein cos α and cos β is the directional cosine of direction l.

By the basic principle of the directional derivative, if the direction that has the fastest magnetic variance ratio in the original signal diagram can be found, the fastest variance ratio can be obtained by processing the original signal. Therefore, the gradient of the magnetic field is utilized in the subsequent processing of the original signal.

The gradient of a certain specific point in a scalar field is a vector, whose gradient direction is the direction that has the largest variance ratio along the field quantity. In a binary function, when function $f(x,y)$ in a plane domain D has a first-order continual partial derivative, every point $P_0(x_0,y_0)$ $\in$D can make a vector $f_x(x_0,y_0)i+f_y(x_0,y_0)j$. Such vector is called the gradient of the function $f(x,y)$ at point $P_0(x_0,y_0)$, which is expressed as grad $f(x_0,y_0)$, that is:

$$\text{grad } f(x_0,y_0)=f_x(x_0,y_0)i+f_y(x_0,y_0)j \quad (8)$$

If the function $f(x,y)$ is differentiable at the point $P_0(x_0, y_0)$, then $e_l=(\cos \alpha, \sin \beta)$ is a unit vector that has the same direction with the direction l, the expression can be written as:

$$\left.\frac{\partial f}{\partial l}\right|_{(x_0,y_0)} = f_x(x_0, y_0)\cos\alpha + f_y(x_0, y_0)\cos\beta \quad (9)$$

$$= \text{grad } f(x,y) \cdot e_l = |\text{grad } f(x_0, y_0)|\cos\theta$$

Wherein, θ=(grad $f(x_0,y_0) \wedge$ e). This expression shows the relations between the gradient of the function at a certain point and the directional derivative of the function at that point. Especially when the included angle θ=0 of the direction vector $e_l$ and grad $f(x_0,y_0)$, which means that along the gradient direction, the directional derivative can obtain the maximum value. This maximum value is the norm |grad $f(x_0,y_0)$| of the gradient. Therefore, the gradient of the function at a point is a vector, whose direction is the direction that the directional derivative of the function at the point obtains the maximum value, wherein its norm equals to the maximum value of the directional derivative.

Figure 27:
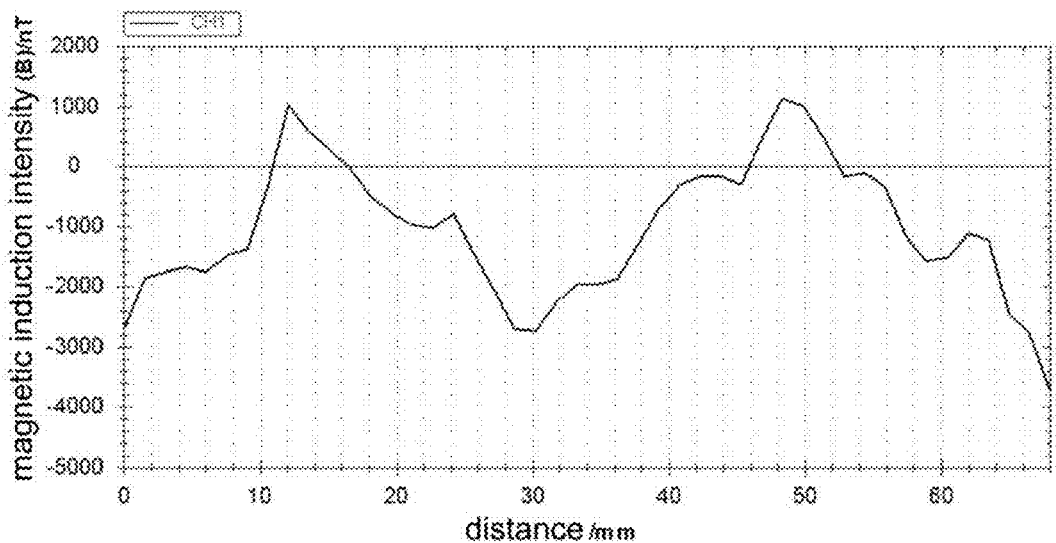
FIG. 27 is a schematic view of signal obtained from gradient processing of the detection signal illustrated in FIG. 22.
Figure 28:
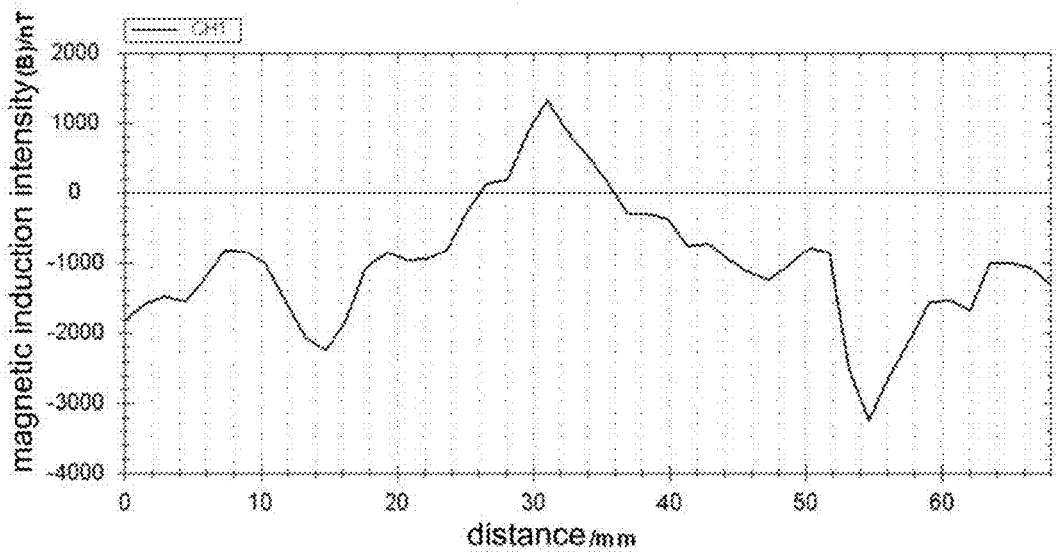
FIG. 28 is a schematic view of signal obtained from gradient processing of the detection signal illustrated in FIG. 23.

FIG. 27 is a schematic view of the signal from gradient processing of the detection signal shown in FIG. 22. FIG. 28 is a schematic view of the signal from gradient processing of the detection signal shown in FIG. 23. Referring to FIGS. 27 and 28, comparing with the original signal, the signal processed by the gradient processing according to the above theory can better indicate the magnitude of the variance ratio of the magnetic field of the test area.

Besides, as stated above, in the actual micro-magnetic detecting procedure, because the collected signal is micro-magnetic signal, interference of noise signal is inevitable. The noise signal, from various sources during the scanning process, including vibration due to rough surface, surrounding magnetic field due to disturbance generated by foreign object like cars, undesired signal created by the electric circuit of the detecting apparatus itself, etc., would influence the micro-magnetic signal. Even the original signal collected by the micro-magnetic detecting apparatus has gone through the magnetic gradient data processing, the noise interference signal would still present. In order to distinguish the defect signal generated from the defect from the interference signal generated from the outside more accurately, the threshold lines are designated to effectively distinguish these two signals.

In the micro-magnetic detecting method according to the embodiment of the present invention, the collected signal belongs to random variable, whose distribution follows the normal distribution. Therefore, when the data was preprocessed according to the rule of the normal distribution, a more reliable confidence interval can be calculated. The threshold can be set easier with the determination of the confidence interval, which makes all possible interference signals during the detecting procedure appear in the set confidence interval and it is almost impossible to have interference signal beyond the interval. Hence, when the original signal has subjected to the data processing, if there is signal appearing beyond the designated threshold line, it can be considered and determined that the signal is the defect signal generated from the defect. Then, the position of the defect can be determined. The obtained signal can be processed with the knowledge of the normal distribution in probability theory. Let be random variable and follow the normal distribution, in which μ is mathematical expectation and σ is mean square error. Therefore, the probability of the random variable ξ being in the interval of (μ−ασ, μ+ασ) can be considered as the size of the area enclosed by the normal distribution curve and x-axis in the interval, that is:

$$P(\xi) = P(\mu - a\sigma < \xi < \mu + a\sigma) = \int_{\mu-a\sigma}^{\mu+a\sigma} ydx \qquad (10)$$

wherein, $$y = P(x) = \frac{1}{\sqrt{2\pi\sigma^2}} e^{-\frac{(x-\mu)^2}{2\sigma^2}} \qquad (11)$$

Figure 29:
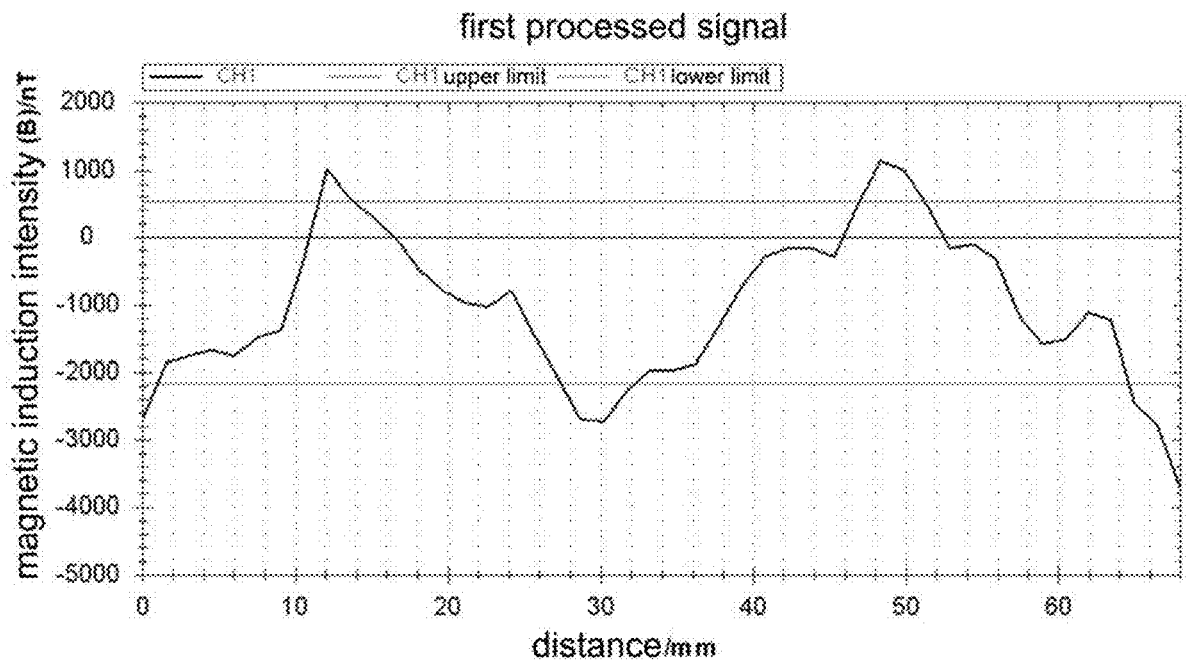
FIG. 29 is a schematic view of threshold lines of the processed detection signal shown in FIG. 27.
Figure 30:
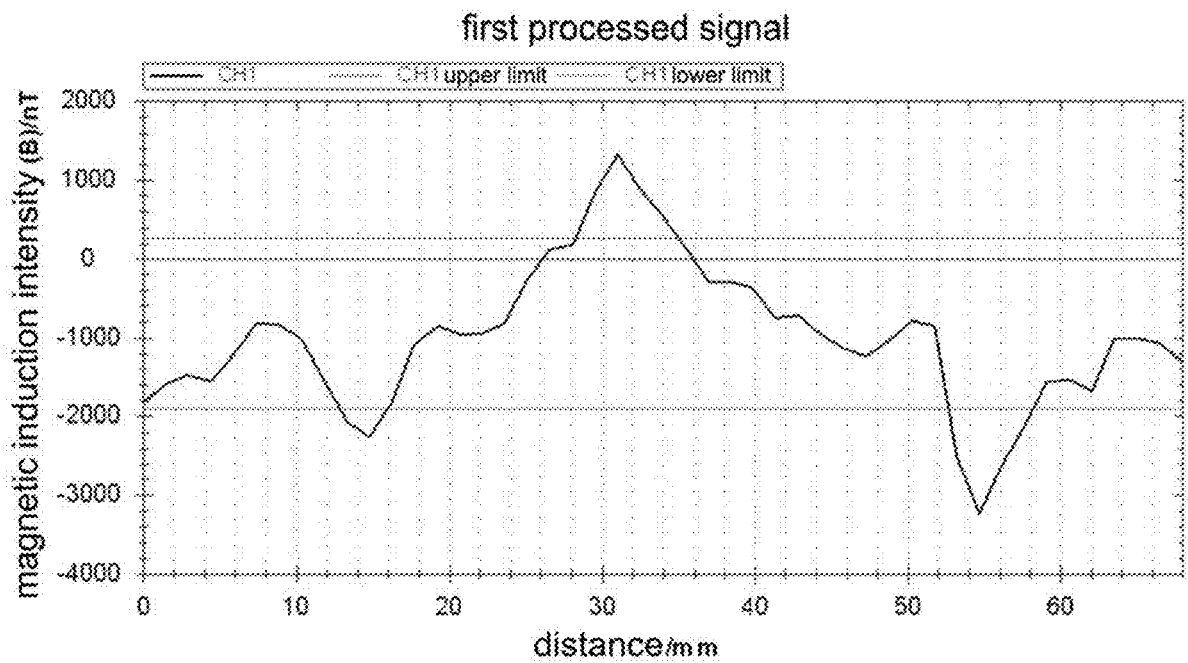
FIG. 30 is a schematic view of threshold lines of the processed detection signal shown in FIG. 28.

According to the above equation, when α has the value of 2.5, its probability will be 0.9875, which is considered that the probability for random signal to present in this area is 98.75%, but when there is no defect, the probability for random signal to present in this area is close to zero. The collected signal is differential processed. The resulting data is calculated for mathematical expectation and variance. Then a value 2.5 of α is substituted into the above equation to obtain the upper threshold line μ+ασ and lower threshold line μ−ασ. Then, the determined upper and lower threshold lines are set in a signal processing figure, as shown in FIGS. 29 and 30, so as to judge the defect signal more reliably. FIG. 29 is a schematic view of a threshold line of the processed detection signal shown in FIG. 27. FIG. 30 is a schematic view of a threshold line of the processed detection signal shown in FIG. 28.

According to the micro-magnetic detecting method of the embodiment of the present invention, it is possible to detect the surface and internal defects of the detected object by detecting the magnetic induction intensity from the surface of the detected object when it remains in its original status. Besides, it is not necessary to fill couplant between the detecting apparatus and the detecting surface. The method also allows contactless detecting. Therefore, the micro-magnetic detecting method according to the embodiment of the present invention enhances detecting efficiency, reduces detecting cost, and improves the adaptability and performance of the detecting apparatus.

Figure 31:
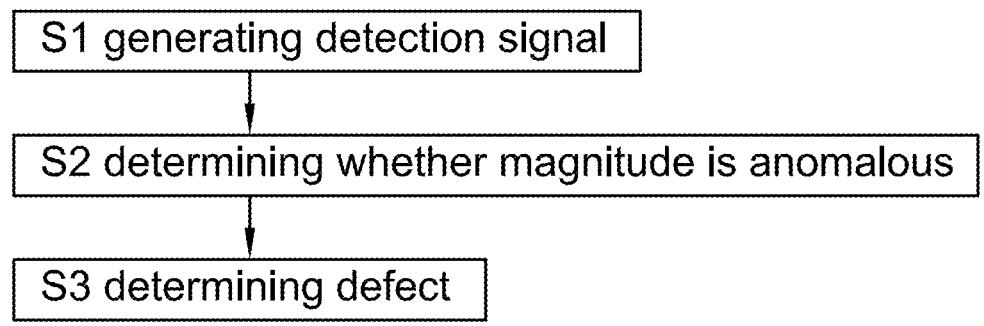
FIG. 31 is a schematic flow diagram of a micro-magnetic detecting method according to an embodiment of the present invention.

FIG. 31 is a schematic flow diagram of the micro-magnetic detecting method according to an embodiment of the present invention. As shown in FIG. 31, the micro-magnetic detecting method according to the embodiment of the present invention includes: S1. detecting the magnetic induction intensity along the first direction on the surface of the detected object to generate detection signal; S2. determining whether the amplitude of the detection signal is the anomalous value at the first position of the surface of the detected object, wherein the anomalous value is a value which is inconsistent with the linear value of the detection signal at the first position, and the linear value is value(s) that satisfies the linear relationship of the detection signal in the first direction; and S3. determining that there is the defect at the first position of the detected object when the amplitude of the detection signal is the anomalous value.

Another aspect of the embodiment of the present invention provides a micro-magnetic detecting device, comprising: a detecting unit for detecting the magnetic induction intensity along the first direction on the surface of the detecting object to generate the detection signal, a calculating unit for determining whether the amplitude of the detection signal is an anomalous value at the first position of the surface of the detected object, wherein the anomalous value is a value which is inconsistent with the linear value of the detection signal at the first position, and the linear value is value(s) that satisfies the linear relationship of the detection signal in the first direction, and a determining unit for determining that there is the defect at the first position of the detected object when the amplitude of the detection signal is the anomalous value.

Figure 32:
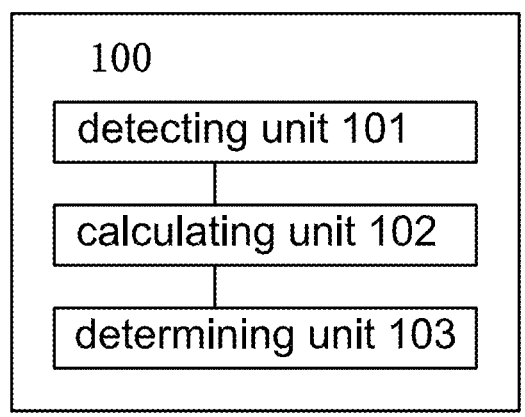
FIG. 32 is a schematic block diagram of a micro-magnetic detecting device according to an embodiment of the present invention.

FIG. 32 is a schematic block diagram of the micro-magnetic detecting device according to an embodiment of the present invention. Referring to FIG. 32, the micro-magnetic detecting device 100 according to the embodiment of the present invention includes: a detecting unit 101 for detecting the magnetic induction intensity along the first direction on the surface of the detecting object to generate the detection signal, a calculating unit 102 for determining whether the amplitude of the detection signal generated by the detecting unit 101 is an anomalous value at the first position of the surface of the detecting object, wherein the anomalous value is a value which is inconsistent with the linear value of the detection signal at the first position, and the linear value is value(s) that satisfies the linear relationship of the detection signal in the first direction, and a determining unit 103 for determining that there is the defect at the first position of the detecting object when the amplitude of the detection signal is determined by the calculating unit 102 as the anomalous value.

In the above micro-magnetic detecting device, in case that a material of the detected object is a paramagnetic material, when a relative magnetic permeability of the first position is smaller than a relative magnetic permeability of the detected object, the anomalous value is greater than the linear value, and when the relative magnetic permeability of the first position is greater than the relative magnetic permeability of the detected object, the anomalous value is smaller than the linear value.

In the above micro-magnetic detecting device, in case that the material of the detected object is a diamagnetic material, when the relative magnetic permeability of the first position is smaller than the relative magnetic permeability of the detected object, the anomalous value is smaller than the linear value, and when the relative magnetic permeability of the first position is greater than the relative magnetic permeability of the detected object, the anomalous value is greater than the linear value.

The above micro-magnetic detecting device further comprises: a drawing unti for drawing a first signal curve of the amplitude of the detection signal against a relative distance of the detected object in the first direction.

In the above micro-magnetic detecting device, the surface of the detected object is parallel to a horizontal plane.

In the micro-magnetic detecting device, the detected object is at least one of a workpiece and/or a weld slit, wherein the defect of the detected object comprises at least one of a surface defect of the workpiece, an internal defect of the workpiece, and/or an internal defect of the weld slit.

In the micro-magnetic detecting device, a magnitude of a difference of the anomalous value and the linear value is corresponding to a size of the defect.

In the above micro-magnetic detecting device, the calculating unit is further for: determining each maximum value and minimum value on the first signal curve, subtracting each maximum value respectively with two adjacent minimum values to obtain a first difference and a second difference, selecting a larger one of the first difference and the second difference as a characteristic of a peak-peak value corresponding to each maximum value, and determining that the amplitude of the detection signal is the anomalous value when the characteristic of the peak-peak value of the first position is larger than a predetermined threshold.

In the above micro-magnetic detecting device, after selecting the larger one of the first difference and the second difference as the characteristic of the peak-peak value corresponding to each maximum value, the calculating unit is further for: based on characteristics of normal distribution of the characteristics of the peak-peak value, when $\xi$ is a random variable, $\mu$ is mathematical expectation, and $\sigma$ is mean square error, calculating the probability of the characteristics of the peak-peak value being in an interval of (0, $\mu+2\sigma$) to be 0.9545 according to formula (1):

$$P(\xi) = P(\mu - a\sigma < \xi < \mu + a\sigma) = \int_{\mu-a\sigma}^{\mu+a\sigma} y\,dx \quad (1)$$

wherein, $$y = P(x) = \frac{1}{\sqrt{2\pi\sigma^2}} e^{-\frac{(x-\mu)^2}{2\sigma^2}} \quad (2)$$

and, $\alpha$ is an abscissa $\mu$ of a standard normal distribution; an interval of the peak-peak value for the probability of 0.9545 is obtained according to formula (1); the determining unit is specifically for: determining that the amplitude of the detection signal is the anomalous value when the characteristics of the peak-peak value of the first position is greater than an upper limit of the interval of the peak-peak value.

The above micro-magnetic detecting device further comprises: a first processing unit for calculating magnetic gradient of the magnetic induction intensity of the detection signal based on the amplitude of the magnetic induction intensity of the detection signal; the drawing unit is specifically for: drawing a first signal curve of the magnetic gradient of the detection signal against the relative distance of the detected object in the first direction; and the calculating unit is specifically for: based on the characteristics of normal distribution of the magnetic gradient, when $\xi$ is a random variable, $\mu$ is mathematical expectation, and $\sigma$ is mean square error, calculating the probability of the magnetic gradient being in the interval of ($\mu-\alpha\sigma$, $\mu+\alpha\sigma$) to be 0.9545 according to formula (1):

$$P(\xi) = P(\mu - a\sigma < \xi < \mu + a\sigma) = \int_{\mu-a\sigma}^{\mu+a\sigma} y\,dx \quad (1)$$

wherein, $$y = P(x) = \frac{1}{\sqrt{2\pi\sigma^2}} e^{-\frac{(x-\mu)^2}{2\sigma^2}} \quad (2)$$

and, $\alpha$ is an abscissa $\mu$ of standard normal distribution; the interval of the magnetic gradient for the probability of 0.9545 is obtained according to formula (1); and determining unit is specifically for: determining that the amplitude of the detection signal is the anomalous value when the magnetic gradient of the first position exceeds the upper or lower limit of the interval of the magnetic gradient.

The above micro-magnetic detecting method further comprises: a second processing unit for conducting a gradient process for the amplitude of the magnetic induction intensity of the detection signal to calculate the gradient vectors of each point of the detection signal, wherein directions of the gradient vectors are the directions in which the first signal curve obtains a maximum value of a directional derivative of a certain point, wherein a norm of the gradient vector equals to the maximum value of the directional derivative; and the drawing unit is specifically for: drawing a first signal curve of the gradient vector of the detection signal against the relative distance of the detected object in the first direction.

In the above micro-magnetic detecting method, the calculating unit is specifically for: based on the characteristics of normal distribution of the gradient vector, when $\xi$ is a random variable, $\mu$ is mathematical expectation, and $\sigma$ is mean square error, calculating the probability of the gradient vector being in the interval of ($\mu-\alpha\sigma$, $\mu+\alpha\sigma$) to be 0.9875 when $\alpha=2.5$ according to formula (1):

$$P(\xi) = P(\mu - a\sigma < \xi < \mu + a\sigma) = \int_{\mu-a\sigma}^{\mu+a\sigma} y\,dx \quad (1)$$

wherein, $$y = P(x) = \frac{1}{\sqrt{2\pi\sigma^2}} e^{-\frac{(x-\mu)^2}{2\sigma^2}} \quad (2)$$

the interval of the gradient vector for $\alpha=2.5$ is obtained according to formula (1); and the determining unit is specifically for: determining that the amplitude of the detection signal is the anomalous value when the gradient vector of the first position exceeds the upper or lower limit of the interval of the gradient vector.

Those skilled in the art should understand that other details of the micro-magnetic detecting device according to the embodiment of the present invention are the same with the corresponding details in the above described micro-magnetic detecting method according to the embodiment of the present invention, therefore it will not repeat again here for redundancy.

With the micro-magnetic detecting method and micro-magnetic detecting device according to the embodiments of the present invention, it is possible to detect the surface and internal defects of a detected object by detecting the magnetic induction intensity from the surface of the detected object when it remains in its original status. Besides, it is not necessary to fill couplant between the detecting apparatus and the detecting surface. The method also allows contactless detecting. Therefore, the micro-magnetic detecting method and micro-magnetic detecting device according to the embodiment of the present invention enhances detecting efficiency, reduces detecting cost, and improves the adaptability and performance of the detecting apparatus.

Certainly, there are many other different embodiments of the present invention. Those skilled in the art should be able to make various corresponding alterations and modifications based on the present invention without departing from the spirit or essence of the present invention, but all these corresponding alterations and modifications shall belong to and be within the extent of protection claimed by the present invention.

One skilled in the art will understand that the embodiment of the present invention as shown in the drawings and described above is exemplary only and not intended to be limiting.

It will thus be seen that the objects of the present invention have been fully and in effectively accomplished. The embodiments have been shown and described for the purposes of illustrating the functional and structural principles of the present invention and is subject to change without departure from such principles. Therefore, this invention includes all modifications encompassed within the spirit and scope of the following claims.

What is claimed is:

1. A micro-magnetic detecting method for a detected object, comprising the steps of:
   (a) detecting a magnetic induction intensity along a first direction on a surface of the detected object and generating a detection signal;
   (b) determining whether an amplitude of the detection signal is an anomalous value at a first position of the surface of the detected object, wherein the anomalous value is a value which is inconsistent with a linear value of the detection signal at the first position and the linear value is a value that satisfies a linear relationship of the detection signal in the first direction;
   (c) determining that there is a defect at the first position of the detected object when the amplitude of the detection signal is the anomalous value; and
   (d) drawing a first signal curve of the amplitude of the detection signal against the relative distance of the detected object in the first direction;
   wherein the step (b) further comprises the steps of:
   (b1) determining each maximum value and minimum value on the first signal curve, subtracting two adjacent minimum values from each maximum value respectively to obtain a first difference and a second difference;
   (b2) selecting a larger one of the first difference and the second difference as a characteristic of a peak-peak value corresponding to each maximum value;
   wherein the step (b2) further comprises the steps of:
   based on characteristics of normal distribution of the characteristics of the peak-peak value, wherein $\xi$ is a random variable following normal distribution, $\mu$ is mathematical expectation, and $\sigma$ is mean square error, calculating a probability P of the characteristics of the peak-peak value being in an interval of $(0, \mu+2\sigma)$ to be 0.9545 and obtaining the peak-peak value for the probability P of 0.9545 according to:

$$P(\xi) = P(\mu - a\sigma < \xi < \mu + a\sigma) = \int_{\mu-a\sigma}^{\mu+a\sigma} y\,dx, \quad (1)$$

where $$y = P(x) = \frac{1}{\sqrt{2\pi\sigma^2}} e^{-\frac{(x-\mu)^2}{2\sigma^2}} \quad (2)$$

and $\alpha$ is an abscissa $\mu$ of a standard normal distribution; and (b3) determining that the amplitude of the detection signal is the anomalous value in case that the characteristic of the peak-peak value of the first position is larger than a predetermined threshold of the interval of the peak-peak value for judging and identifying defect signal and locating the defect.

2. A micro-magnetic detecting method for a detected object, comprising the steps of:
   (a) detecting a magnetic induction intensity along a first direction on a surface of the detected object and generating a detection signal;
   (b) determining whether an amplitude of the detection signal is an anomalous value at a first position of the surface of the detected object, wherein the anomalous value is a value which is inconsistent with a linear value of the detection signal at the first position and the linear value is a value that satisfies a linear relationship of the detection signal in the first direction;
   (c) determining that there is a defect at the first position of the detected object when the amplitude of the detection signal is the anomalous value;
   (d) drawing a first signal curve of the amplitude of the detection signal against a relative distance of the detected object in the first direction; and
   (e) calculating magnetic gradient of the magnetic induction intensity of the detection signal based on the amplitude of the magnetic induction intensity of the detection signal;
   wherein the step (d) further comprises the steps of:
   (d1) drawing a first signal curve of the magnetic gradient of the detection signal against the relative distance of the detected object in the first direction;
   wherein the step (b) further comprises the steps of:
   based on the characteristics of normal distribution of the magnetic gradient, wherein $\xi$ is a random variable following normal distribution, $\mu$ is mathematical expectation, and $\sigma$ is mean square error, calculating a probability P of the magnetic gradient being in an interval of $(\mu-\alpha\sigma, \mu+\alpha\sigma)$ to be 0.9545 obtaining the interval of the magnetic gradient for the probability of 0.9545 according to:

$$P(\xi) = P(\mu - a\sigma < \xi < \mu + a\sigma) = \int_{\mu-a\sigma}^{\mu+a\sigma} y\,dx, \quad (1)$$

where $$y = P(x) = \frac{1}{\sqrt{2\pi\sigma^2}} e^{-\frac{(x-\mu)^2}{2\sigma^2}} \quad (2)$$

and $\alpha$ is an abscissa $\mu$ of a standard normal distribution;
   wherein the step (c) further comprises a step of determining that the amplitude of the detection signal is the anomalous value when the magnetic gradient of the first position exceeds a predetermined threshold of the interval of the magnetic gradient.

3. A micro-magnetic detecting method for a detected object, comprising the steps of:
(a) detecting a magnetic induction intensity along a first direction on a surface of the detected object and generating a detection signal;
(b) determining whether an amplitude of the detection signal is an anomalous value at a first position of the surface of the detected object, wherein the anomalous value is a value which is inconsistent with a linear value of the detection signal at the first position and the linear value is a value that satisfies a linear relationship of the detection signal in the first direction;
(c) determining that there is a defect at the first position of the detected object when the amplitude of the detection signal is the anomalous value;
(d) drawing a first signal curve of the amplitude of the detection signal against the relative distance of the detected object in the first direction; and
(e) conducting a gradient process for the amplitude of the magnetic induction intensity of the detection signal to calculate the gradient vectors of each point of the detection signal, wherein directions of the gradient vectors are the directions in which the first signal curve obtains a maximum value of a directional derivative of a certain point, wherein a norm of the gradient vector equals to the maximum value of the directional derivative;
wherein the step (d) further comprises a step of drawing a first signal curve of the gradient vector of the detection signal against a relative distance of the detected object in the first direction;
wherein the step (c) further comprises the steps of:
(c1) based on the characteristics of normal distribution of the gradient vector, wherein $\xi$ is a random variable following normal distribution, $\mu$ is mathematical expectation, and $\sigma$ is mean square error, calculating a probability P of the gradient vector being in an interval of $(\mu-\alpha\sigma, \mu+\alpha\sigma)$ to be 0.9875 when $\alpha=2.5$ obtaining the interval of the gradient vector for $\alpha=2.5$ according to:

$$P(\xi) = P(\mu - \alpha\sigma < \xi < \mu + \alpha\sigma) = \int_{\mu-\alpha\sigma}^{\mu+\alpha\sigma} y\,dx, \qquad (1)$$

where, $$y = P(x) = \frac{1}{\sqrt{2\pi\sigma^2}} e^{-\frac{(x-\mu)^2}{2\sigma^2}}; \qquad (2)$$

and
(c2) determining that the amplitude of the detection signal is the anomalous value when the gradient vector of the first position exceeds a predetermined threshold of the interval of the gradient vector.

4. A micro-magnetic detecting device, comprising:
a detecting unit detects detecting a magnetic induction intensity along a first direction on a surface of a detected object to generate detection signal;
a calculating unit for determining whether an amplitude of the detection signal is an anomalous value at the first position of the surface of the detected object, wherein the anomalous value is a value which is inconsistent with a linear value of the detection signal at the first position, and the linear value is a value that satisfies a linear relationship of the detection signal in the first direction,
a determining unit for determining that there is a defect at the first position of the detected object when the amplitude of the detection signal is the anomalous value; and
a drawing unit drawing a first signal curve of the amplitude of the detection signal against the relative distance of the detected object in the first direction;
wherein the calculating unit is further executed for:
determining each maximum value and minimum value on the first signal curve;
subtracting two adjacent minimum values from each maximum value respectively to obtain a first difference and a second difference;
selecting a larger one of the first difference and the second difference as a characteristic of a peak-peak value corresponding to each maximum value, and
determining that the amplitude of the detection signal is the anomalous value in case that the characteristic of the peak-peak value of the first position is larger than a predetermined threshold;
wherein after selecting the larger one of the first difference and the second difference as the characteristic of the peak-peak value corresponding to each maximum value, based on characteristics of normal distribution of the characteristics of the peak-peak value, when $\xi$ is a random variable following normal distribution, $\mu$ is mathematical expectation, and $\sigma$ is mean square error, the calculating unit is specifically for calculating a probability P of the characteristics of the peak-peak value being in an interval of $(0, \mu+2\sigma)$ to be 0.9545 and obtaining the probability of 0.9545 for the peak-peak value according to:

$$P(\xi) = P(\mu - \alpha\sigma < \xi < \mu + \alpha\sigma) = \int_{\mu-\alpha\sigma}^{\mu+\alpha\sigma} y\,dx, \qquad (1)$$

where $$y = P(x) = \frac{1}{\sqrt{2\pi\sigma^2}} e^{-\frac{(x-\mu)^2}{2\sigma^2}} \qquad (2)$$

and $\alpha$ is an abscissa $\mu$ of a standard normal distribution;
wherein the determining unit is specifically for determining that the amplitude of the detection signal is the anomalous value when the characteristics of the peak-peak value of the first position is greater than a predetermined threshold of the interval of the peak-peak value.

5. A micro-magnetic detecting device, comprising:
a detecting unit detecting a magnetic induction intensity along a first direction on a surface of a detected object to generate detection signal;
a calculating unit for determining whether an amplitude of the detection signal is an anomalous value at the first position of the surface of the detected object, wherein the anomalous value is a value which is inconsistent with a linear value of the detection signal at the first position, and the linear value is a value that satisfies a linear relationship of the detection signal in the first direction,
a determining unit for determining that there is a defect at the first position of the detected object when the amplitude of the detection signal is the anomalous value;

a drawing unit drawing a first signal curve of the amplitude of the detection signal against the relative distance of the detected object in the first direction;

and a first processing unit calculating magnetic gradient of the magnetic induction intensity of the detection signal based on the amplitude of the magnetic induction intensity of the detection signal;

wherein the drawing unit is specifically for drawing a first signal curve of the magnetic gradient of the detection signal against the relative distance of the detected object in the first direction;

wherein, the calculating unit is specifically for, based on the characteristics of normal distribution of the magnetic gradient, when $\xi$ is a random variable, $\mu$ is mathematical expectation, and $\sigma$ is mean square error, calculating a probability P of the magnetic gradient being in the interval of $(\mu-\alpha\sigma, \mu+\alpha\sigma)$ to be 0.9545 and obtaining the interval of the magnetic gradient for the probability of 0.9545 according to:

$$P(\xi) = P(\mu - a\sigma < \xi < \mu + a\sigma) = \int_{\mu-a\sigma}^{\mu+a\sigma} y\,dx, \quad (1)$$

where $$y = P(x) = \frac{1}{\sqrt{2\pi\sigma^2}} e^{-\frac{(x-\mu)^2}{2\sigma^2}} \quad (2)$$

and $\alpha$ is an abscissa $\mu$ of a standard normal distribution;

wherein the determining unit is specifically for determining that the amplitude of the detection signal is the anomalous value when the magnetic gradient of the first position exceeds a predetermined threshold of the interval of the magnetic gradient.

6. A micro-magnetic detecting device, comprising:

a detecting unit detecting a magnetic induction intensity along a first direction on a surface of a detected object to generate detection signal;

a calculating unit for determining whether an amplitude of the detection signal is an anomalous value at the first position of the surface of the detected object, wherein the anomalous value is a value which is inconsistent with a linear value of the detection signal at the first position, and the linear value is a value that satisfies a linear relationship of the detection signal in the first direction;

a determining unit for determining that there is a defect at the first position of the detected object when the amplitude of the detection signal is the anomalous value;

a drawing unit drawing a first signal curve of the amplitude of the detection signal against the relative distance of the detected object in the first direction; and a second processing unit conducting a gradient process for the amplitude of the magnetic induction intensity of the detection signal to calculate the gradient vectors of each point of the detection signal, wherein directions of the gradient vectors are the directions in which the first signal curve obtains a maximum value of a directional derivative of a certain point, wherein a norm of the gradient vector equals to the maximum value of the directional derivative, and the drawing unit is specifically for drawing a first signal curve of the gradient vector of the detection signal against the relative distance of the detected object in the first direction;

wherein, the calculating unit is specifically for, based on the characteristics of normal distribution of the gradient vector, when $\xi$ is a random variable following normal distribution, $\mu$ is mathematical expectation, and $\sigma$ is mean square error, calculating the probability of the gradient vector being in the interval of $(\mu-\alpha\sigma, \mu+\alpha\sigma)$ to be 0.9875 when $\alpha=2.5$ and obtaining the interval of the gradient vector for $\alpha=2.5$ according to:

$$P(\xi) = P(\mu - a\sigma < \xi < \mu + a\sigma) = \int_{\mu-a\sigma}^{\mu+a\sigma} y\,dx, \quad (1)$$

where $$y = P(x) = \frac{1}{\sqrt{2\pi\sigma^2}} e^{-\frac{(x-\mu)^2}{2\sigma^2}}; \quad (2)$$

wherein the determining unit is specifically for determining that the amplitude of the detection signal is the anomalous value when the gradient vector of the first position exceeds a predetermined threshold of the interval of the gradient vector.

* * * * *